(12) United States Patent
Miyazaki et al.

(10) Patent No.: US 7,027,595 B2
(45) Date of Patent: Apr. 11, 2006

(54) TELECOMMUNICATIONS APPARATUS AND PLUG-IN UNIT FOR SAME

(75) Inventors: Takehide Miyazaki, Kawasaki (JP); Kazuhiro Iino, Kawasaki (JP); Naoya Yamazaki, Kawasaki (JP); Tomoyuki Hongoh, Kawasaki (JP); Yoshinori Hoshino, Kawasaki (JP); Yoshiaki Tada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 884 days.

(21) Appl. No.: 09/814,226

(22) Filed: Mar. 21, 2001

(65) Prior Publication Data

US 2002/0061102 A1    May 23, 2002

(30) Foreign Application Priority Data

Nov. 22, 2000 (JP) .............................. 2000-356010
Jan. 29, 2001 (JP) .............................. 2001-020587

(51) Int. Cl.
*H04M 1/00* (2006.01)
*H04M 9/00* (2006.01)

(52) U.S. Cl. ........................... 379/413.04; 379/413.03; 379/325; 379/330; 379/332

(58) Field of Classification Search ................ 379/413.01–413.04, 325–332
See application file for complete search history.

(56) References Cited

U.S. PATENT DOCUMENTS

| | | | | |
|---|---|---|---|---|
| 4,743,080 A | * | 5/1988 | Siraty | 439/492 |
| 4,886,463 A | * | 12/1989 | Scott et al. | 439/89 |
| 5,266,053 A | * | 11/1993 | Jamet et al. | 439/607 |
| 5,646,369 A | * | 7/1997 | Miska et al. | 174/35 GC |
| 6,526,212 B1 | * | 2/2003 | Mishriky et al. | 385/138 |
| 2001/0004316 A1 | * | 6/2001 | Denzene et al. | 361/816 |

* cited by examiner

*Primary Examiner*—Sinh Tran
*Assistant Examiner*—Ramnandan Singh
(74) *Attorney, Agent, or Firm*—Katten Muchin Rosenman LLP

(57) ABSTRACT

A telecommunications apparatus that has a substantially box-shaped subrack having a back wiring board mounting a connector and a plurality of shell-type plug-in units inserted in the subrack so that a connector of each of the plug-in units is connected to the connector of the subrack, further includes a flexible, electrically conductive seal member elastically deformedly disposed between a lateral surface of the plug-in unit inserted into the subrack and an interior portion of the subrack so as to enclose both the plug-in unit connector.

13 Claims, 23 Drawing Sheets

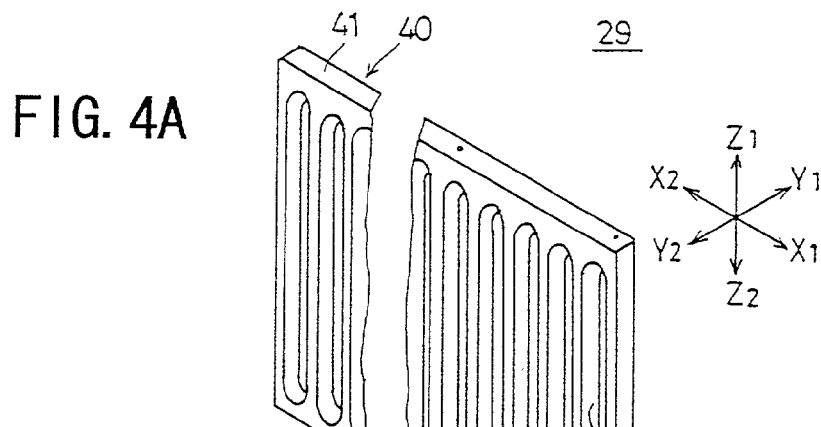
FIG. 4A
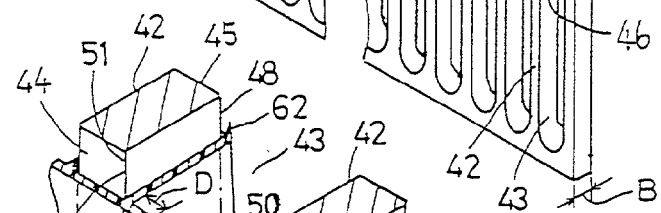
FIG. 4B
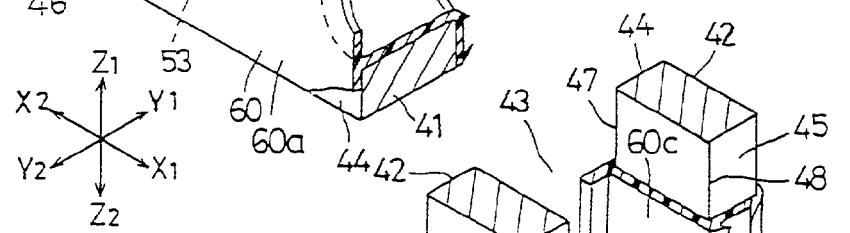
FIG. 4C
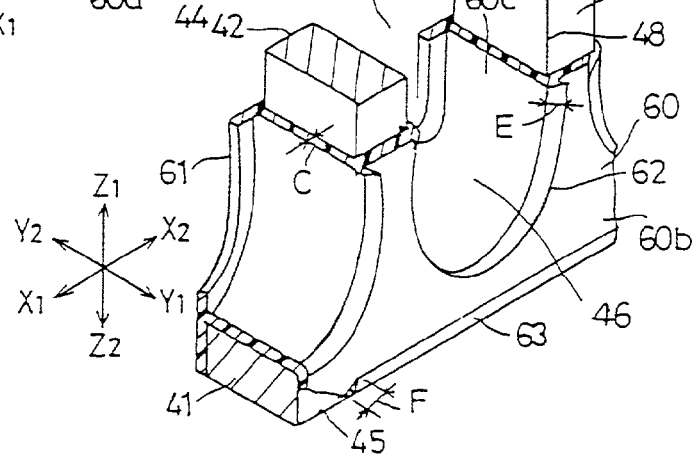

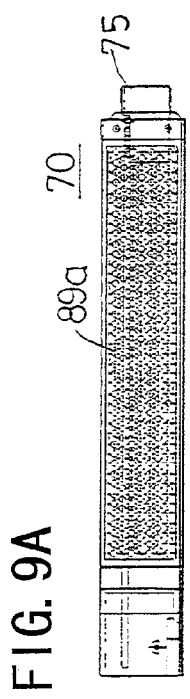
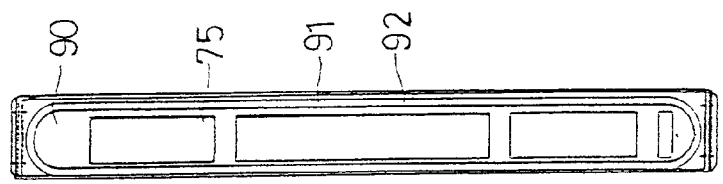
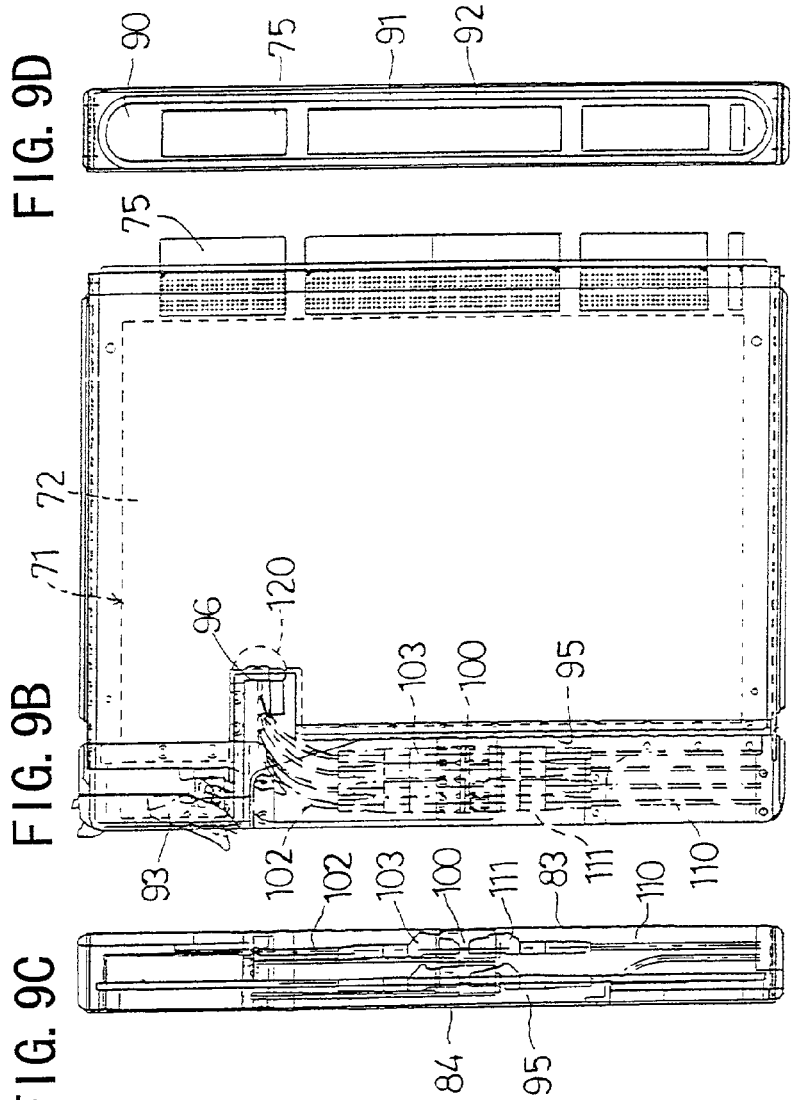
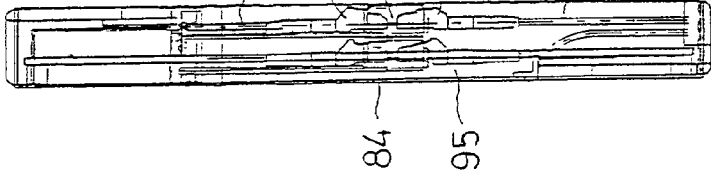

TELECOMMUNICATIONS APPARATUS AND PLUG-IN UNIT FOR SAME

BACKGROUND OF THE INVENTION

1. Field of the Invention

The present invention relates to a telecommunications apparatus, and more particularly, to a telecommunications apparatus of a type typically used in telecommunications stations to carry out high-speed telecommunications, in which a plurality of shell-type plug-in units are aligned inside a subrack which is mounted in a rack.

2. Description of Related Art

Together with the growing importance of telecommunications in recent years there is a growing need for improvements in the quality of the telecommunications equipment used in station buildings and the like. One such improvement in quality has to do with lowering the amount of electromagnetic interference (EMI) radiated from such equipment, as well as reducing the electromagnetic susceptibility (EMS) of such equipment to external EMI. Taken together, these measures are an index of the electromagnetic compatibility, or EMC, of the equipment.

Additionally, the transmission capacity of telecommunications equipment continues to increase. Such increases in transmission capacity require increasing the transmission frequencies of the oscillators mounted in the plug-in units. At present the frequencies are on the order of 10 GHz, though the next generation of telecommunications equipment should see frequencies on the order of 40 GHz.

Ordinarily, conventional telecommunications equipment is designed so that a connector on an end of the plug-in unit that is inserted into the subrack is connected to a connector on a back wiring board of the subrack and mounted in the subrack thereby.

Conventionally, a cover or shield is provided on the front of the subrack into which the plug-in units are so closely packed and inserted in order to reduce EMI emissions. Thus measures to improve EMC are carried out on a per-subrack-unit basis, one subrack at a time.

Indeed, a variety of telecommunications equipment has been developed in which measures to improve EMC have been conducted on the subrack level. These types of telecommunications equipment use a so-called shell construction for the plug-in unit, in which the printed board on which the circuits are mounted is enclosed within a metal casing.

The shell-type plug-in unit is inserted into the subrack, so an exposed connector is provided at an end of the plug-in unit that is inserted into the subrack. This exposed connector thus lacks adequate EMC, and thus it is necessary to shield the insertion end of the plug-in unit when the plug-in unit is inserted in the subrack, that is, when the plug-in unit connector is connected to the back wiring board connector.

FIGS. 1A and 1B are diagrams in which a plug-in unit for a telecommunications apparatus previously suggested by the applicant is shown in a state just prior to mounting in a subrack and in a state in which the plug-in unit is mounted in the subrack, respectively.

As shown in the diagrams, a plug-in unit 1 is constructed such that a leaf spring member 3 surrounds a connector 2. A subrack 10 is constructed so that a metal frame member 12 is fixedly mounted on a front surface of a back wiring board 11, with ribs 13 positioned along both sides of a connector 14. In a state in which the plug-in unit 1 is mounted in the subrack 10 as shown in FIG. 1B, the leaf spring members 3 contact the ribs 13, thus fully shielding the inserted end of the plug-in unit 1 over its entire periphery.

Here, the permissible slot length allowed to that portion shielded from electromagnetic radiation greatly effects the effectiveness of that shield. Shield effectiveness in the case of a slot is expressed as S=20 log (wavelength÷(2×slot length)) dB. For example, in the case of a telecommunications apparatus having a 40 GHz oscillator, the wavelength of the signal generated by the oscillator is 7.5 mm. Accordingly, a slot length equal to 1/20 of that wavelength (or 0.37 mm) would have a shielding effect of 20 dB, a slot length equal to 1/30 of that wavelength (0.25 mm) would have a shielding effect of 23 dB, and a slot length equal to 1/40 of that wavelength (0.1875 mm) would have a shielding effect of 26 dB. Thus, as can be appreciated, the smaller the length of the slot the greater the shielding effect provided. Additionally, because the shielding effect is a function of the wavelength, for a given slot length the shielding effect will vary with the wavelength of the generated signal, so for example a 1.5 mm slot is permissible in order to attain a shielding effect of 20 dB with a wavelength of 10 GHz but the same slot length of 1.5 mm produces a shielding effect of only 8 dB when the wavelength is 40 GHz.

Additionally, the shield effect is also related to the number of slots, and is expressed as $$S = -20 \log \sqrt{n},$$

where n is the number of slots, so that, for example, when there are two slots the shielding effect declines by −3 dB. Thus, where the shielding effect is 20 dB with one slot, the additional slot reduces the shielding effect to 17 dB.

As described above, in order to increase the shield effect it is necessary to make the length of the slot 1/30 to 1/40 of the wavelength of the generated signals, which indicates that, in the case of ultra-high signals on the order of 40 GHz, essentially no gap at all is permissible.

However, even the best machining of the surfaces of the ribs 13 leaves an undulation thereon. Such undulations weaken the contact between the leaf spring members 3 and the ribs 13, that is, create a gap between the leaf spring members 3 and the surfaces of the ribs 13.

As a result, telecommunications equipment having the structure shown in FIGS. 1A and 1B is not capable of providing adequate EMC where the oscillators generate signals on the order of 40 GHz, and hence are not suitable for the next generation of telecommunications equipment.

BRIEF SUMMARY OF THE INVENTION

Accordingly, it is an object of the present invention to provide an improved and useful telecommunications apparatus and plug-in unit for same in which the above-described disadvantage is eliminated.

The above-described object of the present invention is achieved by a telecommunications apparatus including a substantially box-shaped subrack having a back wiring board mounting a connector and a plurality of shell-type plug-in units inserted in the subrack so that a connector of each of the plug-in units is connected to the connector of the subrack, the telecommunications apparatus comprising:

a flexible, electrically conductive seal member elastically deformed and disposed between a lateral surface of the plug-in unit inserted into the subrack and an interior portion of the subrack so as to enclose both the plug-in unit connector.

According to this aspect of the invention, the plastic deformation of the seal member follows any undulation of the surface of the inserted edge of the plug-in unit as well as any undulation of the surface of the interior portion of the subrack. As a result, no gap occurs between the inserted edge of the inserted plug-in unit and the interior of the subrack.

The above-described object of the present invention is also achieved by a telecommunications apparatus including a substantially box-shaped subrack having a back wiring board mounting a connector and a plurality of shell-type plug-in units inserted in the subrack so that a connector of each of the plug-in units is connected to the connector of the subrack, the subrack comprising:

a frame member comprising a substantially square metallic frame, a plurality of panes aligned within the frame so as to form substantially rectangular openings that accommodate and surround the back wiring board connectors between adjacent panes, and a flexible, electrically conductive seal member covering the frame and the panes, the frame member being fixedly mounted on a surface of the back wiring board disposed opposite the inserted edge of the plug-in unit, a portion of a lateral surface of the plug-in unit inserted into the subrack and surrounding the plug-in unit connector pressing against the frame member so as to elastically deform the seal member and close the openings when the plug-in unit is inserted into the subrack.

According to this aspect of the invention, the frame has higher mechanical rigidity and smaller electrical resistance than in the case of frame is made only by flexible electrically conductive seal member. The elastic deformation of the seal member conforms the seal to any undulations in the surface of the lateral side of the plug-in unit inserted into the subrack as well as to any undulations in the surface of the interior portion of the subrack. As a result, no gap occurs between the inserted lateral edge of the plug-in unit and the seal member.

Additionally, the above-described object of the present invention is also achieved by a telecommunications apparatus including a substantially box-shaped subrack having a back wiring board mounting a connector and a plurality of shell-type plug-in units inserted in the subrack so that a connector of each of the plug-in units is connected to the connector of the subrack, the subrack comprising:

a frame member comprising a substantially square metallic frame and a plurality of panes aligned within the frame so as to form substantially rectangular openings that accommodate and surround the back wiring board connectors between adjacent panes, the frame member being fixedly mounted on a surface of the back wiring board disposed opposite the inserted edge of the plug-in unit; and a seal member comprising a long, thin core spring member, a finger gasket that engages the core spring member and an electrically conductive cloth wrapped around the finger gasket, the seal member being mounted on inner sides of the frame member openings so as to extend over an entire interior surface of said openings, the plug-in unit having a cover part shaped so as to conform to the frame member openings and surround the plug-in unit connectors on a lateral surface of the plug-in unit inserted into the subrack, edge surfaces of the cover projecting beyond edges of the plug-in unit connector, the cover part fitting the frame member openings when the plug-in unit is inserted into the subrack so as to elastically deform the finger gasket, a restorative force of the elastically deformed finger gasket causing the electrically conductive cloth to contact the cover part along an entire outer periphery surface of the cover part.

According to this aspect of the invention, use of the restorative force of the elastically deformed finger gasket to contact the electrically conductive cloth against the entire outer surface of the cover part results in a continuing state of contact, in which no gap occurs. Moreover, the restorative force of the elastically deformed finger gasket is maintained over time and does not deteriorate.

Additionally, the above-described object of the present invention is also achieved by a shell-type plug-in unit enclosed by a metal casing, containing a printed board therein and inserted into a substantially box-shaped subrack having a back wiring board mounting a connector so that a connector of the plug-in unit is connected to the connector of the subrack, a lateral surface of the plug-in unit inserted into the subrack and surrounding the plug-in unit connector having a substantially oblong banked portion with a tapered periphery.

According to this aspect of the invention, as compared to a case in which the rib portion is oblong in shape, the tapered surface of the rib portion is securely contacted across its entire area by the subrack seal member.

Additionally, the above-described object of the present invention is also achieved by a shell-type plug-in unit enclosed by a metal casing, containing a printed board therein and inserted into a substantially box-shaped subrack having a back wiring board mounting a connector so that a connector of the plug-in unit is connected to the connector of the subrack, the plug-in unit having a cover part shaped so as to conform to the frame member openings and surround the plug-in unit connectors on a lateral surface of the plug-in unit inserted into the subrack, edge surfaces of the cover part projecting beyond edges of the plug-in unit connector.

According to this aspect of the invention, the cover part surrounds the plug-in unit connector and, further, the projection of the edge surfaces of the cover part beyond the edges of the plug-in unit connector protect the plug-in unit connector from damage if the plug-in unit is incorrectly inserted and dropped to the floor.

Other objects, features and advantages of the present invention will become more apparent from the following detailed description when read in conjunction with the accompanying drawings.

BRIEF DESCRIPTION OF THE DRAWINGS

FIGS. 4A, 4B and 4C are perspective views of the frame member;

FIGS. 9A, 9B, 9C and 9D are diagrams showing top, left lateral, rear and right lateral views, respectively, of a shell-type construction plug-in unit;

DETAILED DESCRIPTION OF THE INVENTION

A description will now be given of embodiments of the present invention, with reference to the accompanying drawings. It should be noted that identical or corresponding elements in the embodiments are given identical or corresponding reference numbers in all drawings, with detailed descriptions of such elements given once and thereafter omitted.

Figure 1A:
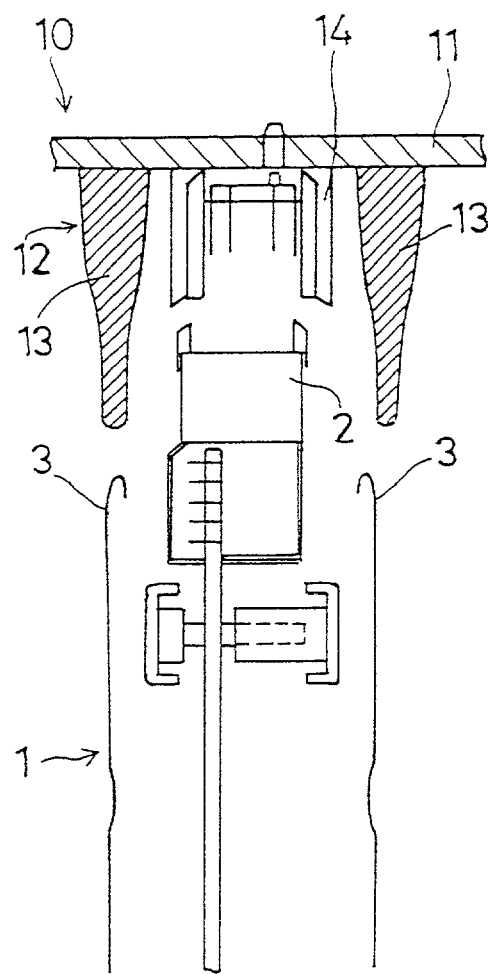
FIGS. 1A and 1B are diagrams in which a plug-in unit for a telecommunications apparatus previously suggested by the applicant is shown in a state just prior to mounting in a subrack and in a state in which the plug-in unit is mounted in the subrack, respectively.
Figure 1B:
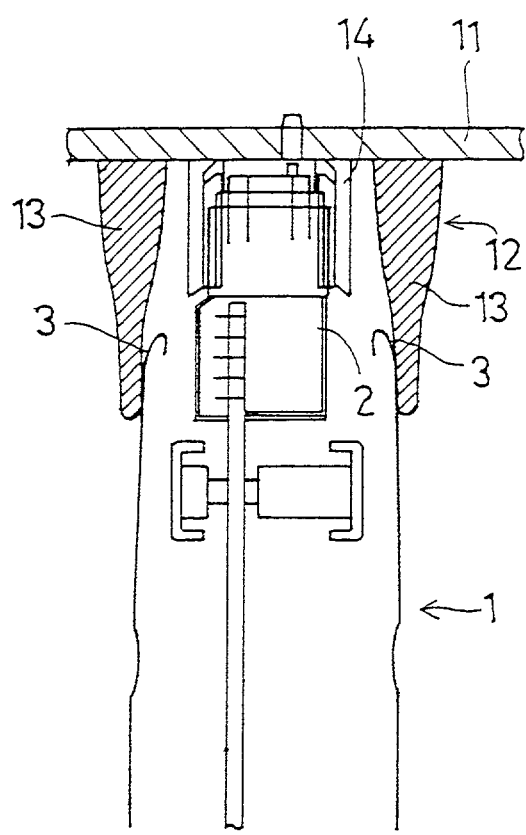
Figure 2:
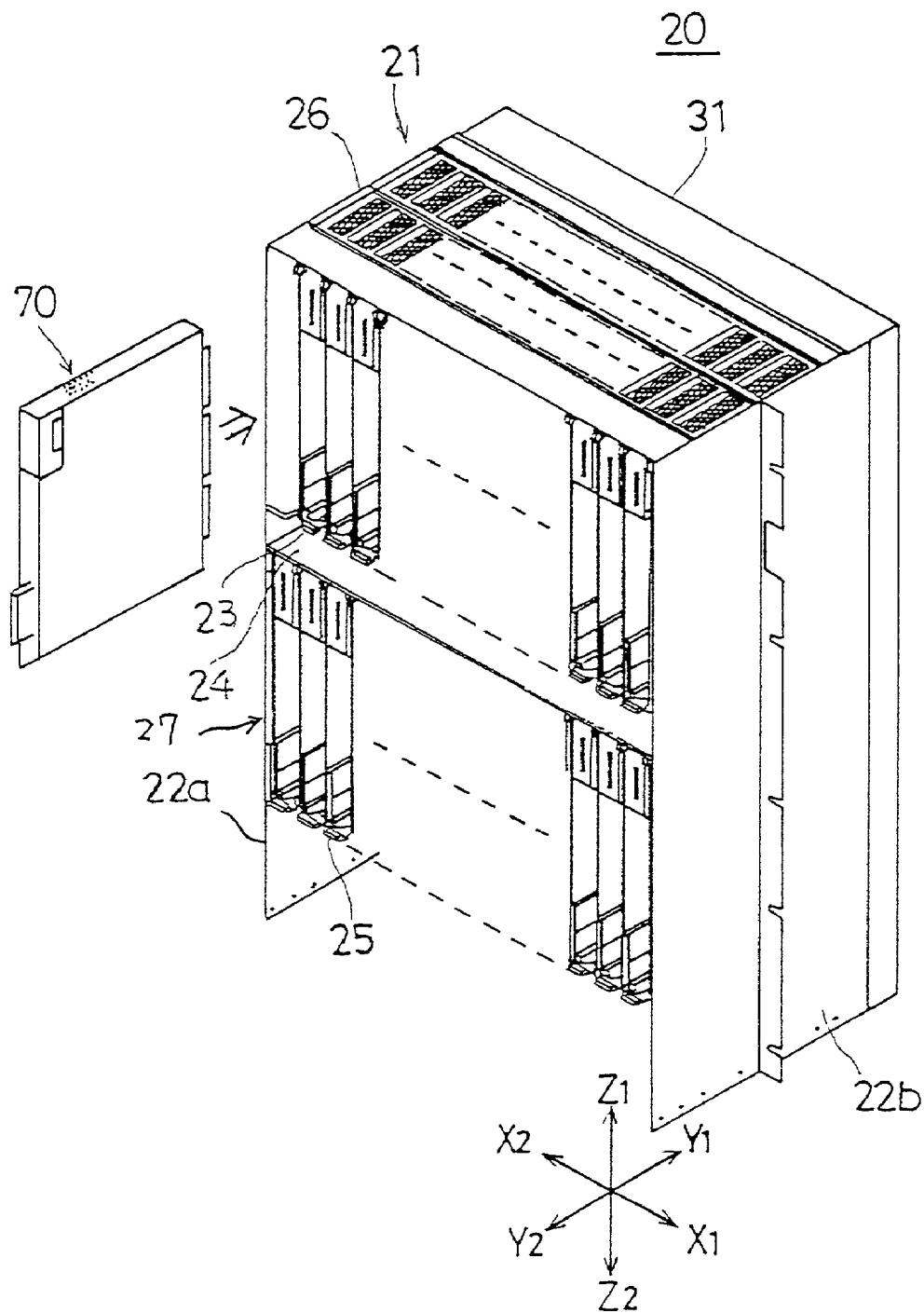
FIG. 2 is a diagram showing a perspective view of a telecommunications apparatus according to a first embodiment of the present invention.
Figure 3:
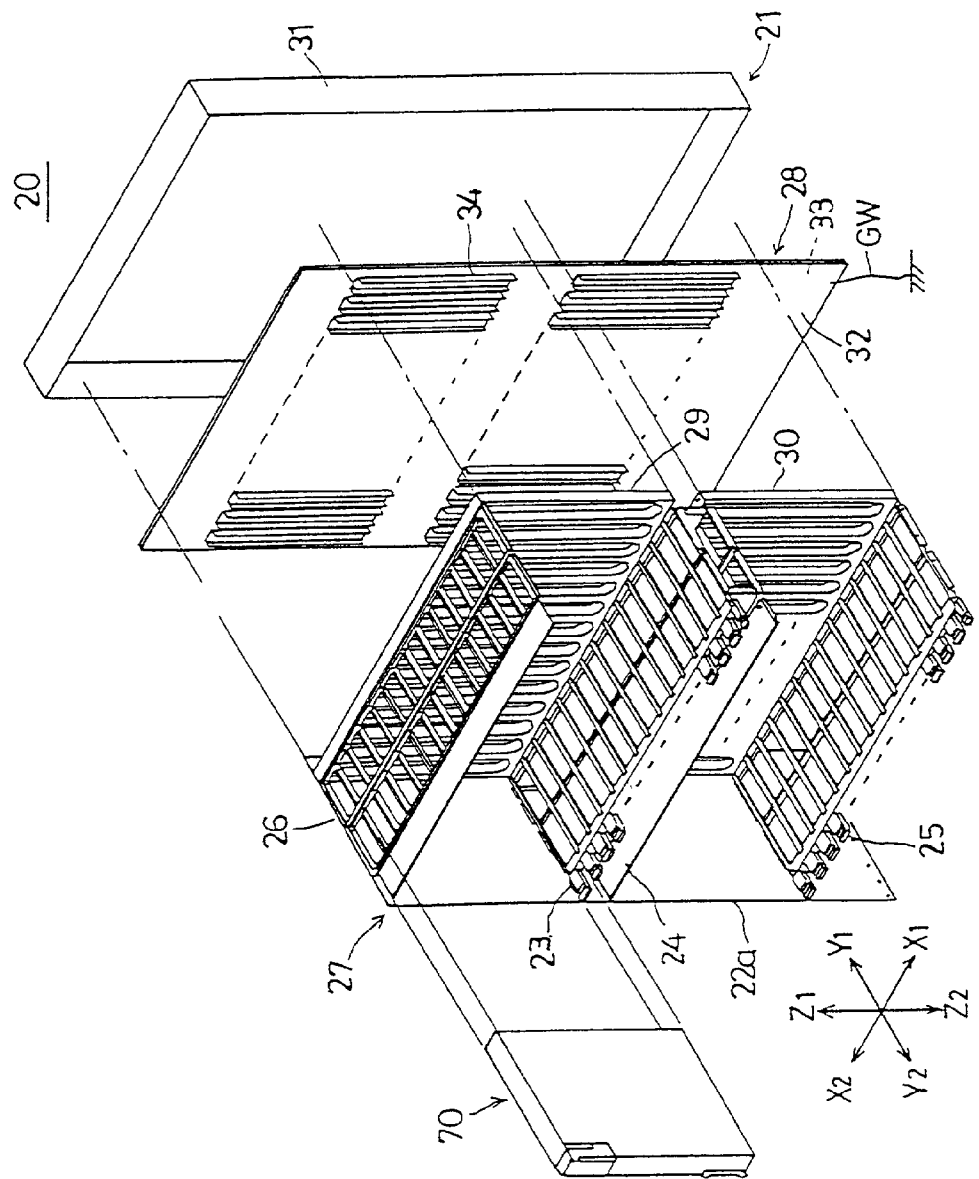
FIG. 3 is an exploded perspective view of the subrack unit shown in FIG. 2.
Figure 5A:
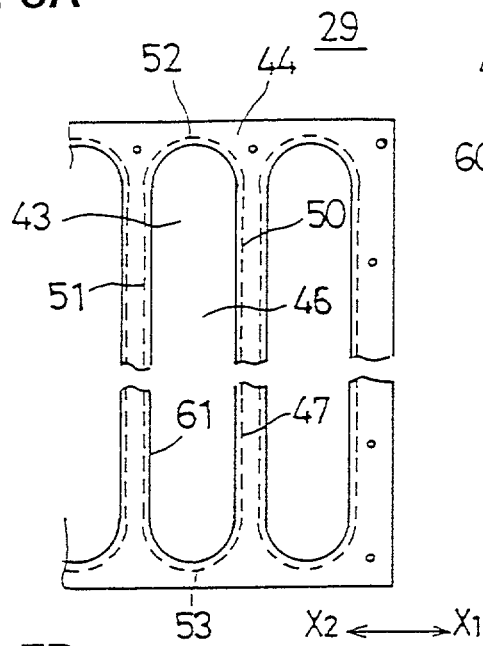
FIGS. 5A, 5B, 5C, 5D and 5E are diagrams showing front, top, rear, lateral and lateral cross-sectional views of the frame member along the line E-E in FIG. 5C, respectively.
Figure 5D:
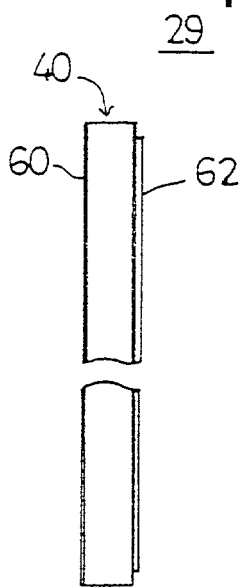
Figure 5B:
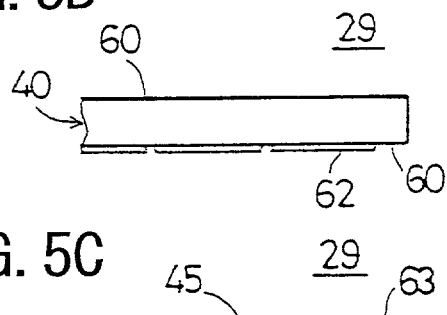
Figure 5E:
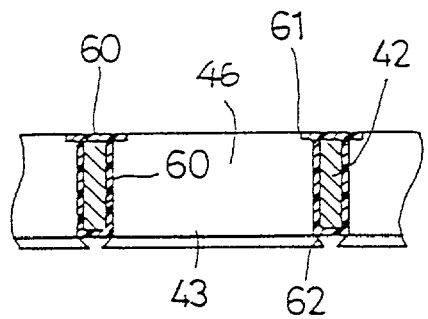
Figure 5C:
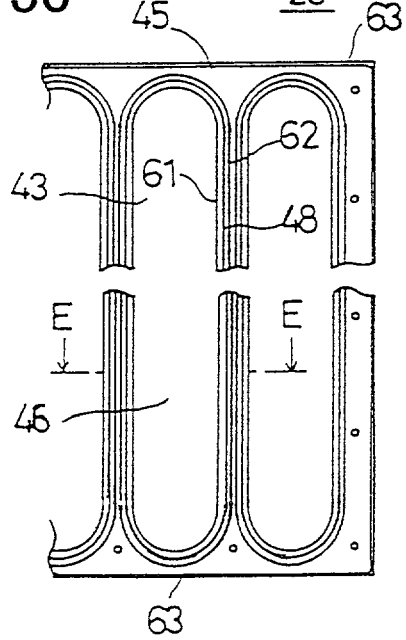

FIG. 2 is a diagram showing a perspective view of the telecommunications apparatus according to a first embodiment of the present invention. FIG. 3 is an exploded perspective view of the subrack unit shown in FIG. 2. For convenience of description, a direction along an X axis denotes a direction in a width of a telecommunications apparatus 20, a direction along a Y axis denotes a direction in a depth of the telecommunications apparatus 20 and a direction along a Z axis denotes a direction in a height of the telecommunications apparatus 20.

As shown in the diagrams, the telecommunications apparatus 20 is configured so that a plurality of plug-in units 70 are inserted in a subrack 21, the plug-in units being inserted from the Y2 direction toward the Y1 direction and aligned horizontally in the Z1–Z2 direction and, further, divided into two shelves vertically in the Z1–Z2 direction. The particular telecommunications apparatus 20 depicted in the diagrams is forced-air cooled by an updraft created by a fan motor not shown in the diagram and, further, operates at a 40 GHz signal. Additionally, the telecommunications apparatus 20 depicted in the diagrams is mounted between posts to the left and right of the subrack 21, and in that state used in a telecommunications station buildings.

In order to further an understanding of the present invention, a description will first be given of the subrack 21.

The subrack 21 is a substantially square box 27 comprising left- and right-side panels 22a, 22b, respectively, guide-rail equipped intermediate dividing panels 23, 24, a guide-rail equipped top panel 26 and a guide-rail equipped bottom panel 25, a rear-side back wiring board (hereinafter BWB) 28, front-side frame members 29, 30 and a cover 31 that covers a rear surface of the BWB 28. Side surfaces of the frame member 29 are fastened as appropriate to the side panels 22a, 22b and top panel 26 by screws, with side surfaces of the frame member 30 being fastened to the side panels 22a, 22b by screws.

Figure 6A:
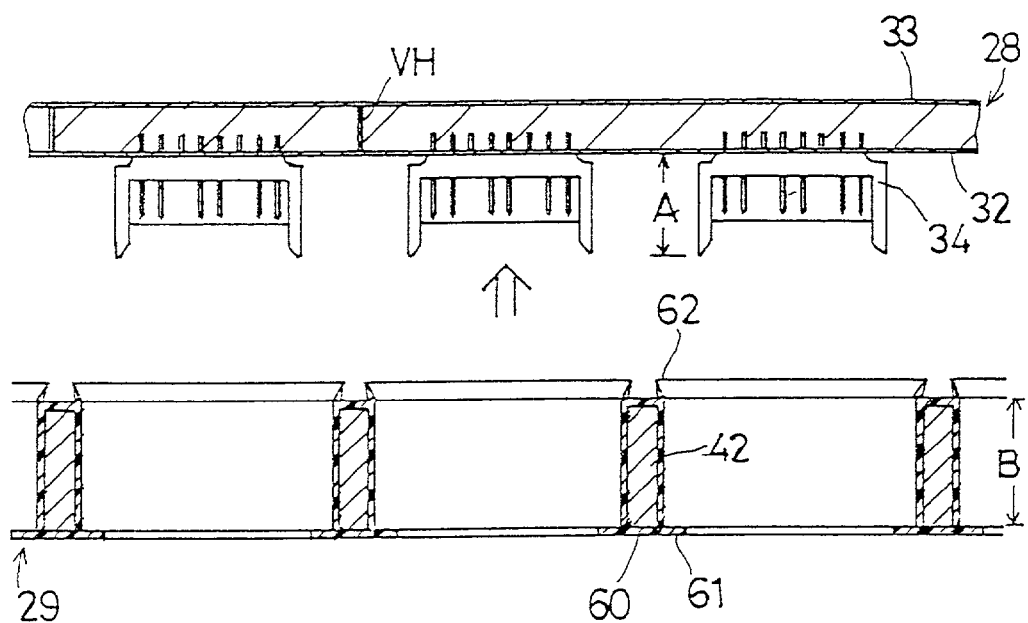
FIGS. 6A and 6B are diagrams showing the relationship between the back wiring board and the frame member.
Figure 6B:
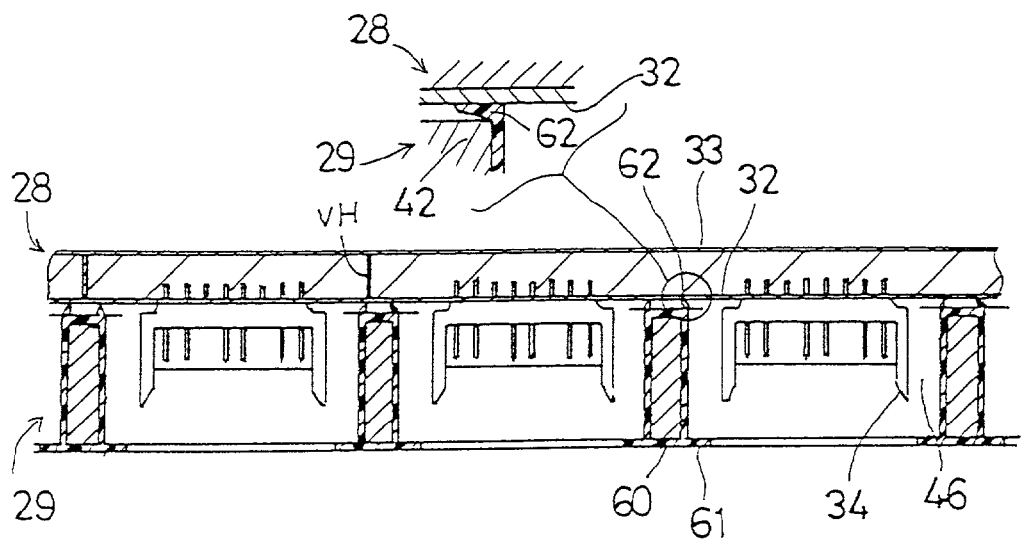

FIGS. 6A and 6B are diagrams showing the relationship between the back wiring board and the frame member.

As can be seen when viewed in conjunction with FIGS. 6A and 6B, the BWB 28 has a plurality of inlaid patterns as well as frame ground layers 32, 33 that extend across the entire front and rear surfaces of the BWB 28. The frame ground layers 32 and 33 are electrically connected by a plurality of via holes VH. As shown in FIG. 3, a ground wire GW lead extended from inside the telecommunications station is connected to the frame ground layer 33. Additionally, a plurality of sheet connectors 34 are mounted on a front surface of the BWB 28 aligned in two stories or stages vertically in the Z1–Z2 direction as well as parallel to each other in the horizontal X1–X2 direction. Different sheet connectors 34 are connected electrically by inlaid wiring patterns.

FIGS. 4A, 4B and 4C are perspective views of the frame member. FIGS. 5A, 5B, 5C, 5D and 5E are diagrams showing front, top, rear, lateral and lateral cross-sectional views of the frame member along the line E—E in FIG. 5C, respectively.

As shown in the diagrams, the frame member 29 comprises an aluminum diecast main frame 40 and an electrically conductive seal member 60 that covers the main frame 40. The main frame 40 enhances both the electrical conductivity and the rigidity of the electrically conductive seal member 60.

The coating 60 and the electrically conductive rubber that forms flanges 61, 62 and 63 to be described later, is composite rubber including a metallic filler or carbon so as to obtain electrical conductivity, and has a volume resistivity of 0.005 Ω cm.

The frame member 29 main frame 40 comprises a frame 41 elongated in the horizontal X1–X2 direction, a plurality of vertical panes 42 extending vertically in the Z1–Z2 direction, and a plurality of oblong openings 43 formed by and between the vertical panes 42, extending vertically in the Z1–Z2 direction and aligned in parallel horizontally in the X1–X2 direction. Reference numerals 44 and 45 represent front and rear surfaces, respectively, of the main frame 40. The oblong-shaped openings 43 are of a size that accommodates and encloses the above-described sheet connectors 34, and are positioned so as to be aligned with the sheet connectors 34.

FIGS. 6A and 6B are diagrams showing the relationship between the back wiring board and the frame member.

As shown in FIG. 4A, the main frame 40 has a thickness B that exceeds a length A by which the sheet connector 34 projects from the BWB 28 in the Y2 direction. In a state in which the main frame 40 is mounted on the front surface of the BWB 28, the oblong openings 43 form substantially cylindrical spaces 46. As shown in FIG. 6B, the sheet connectors are accommodated within these substantially cylindrical spaces.

As shown in FIGS. 4A, 4B, 4C and FIGS. 5A, 5B, 5C, 5D and 5E, the oblong openings 43 have an edge part 47 formed in the front surface 44 of the main frame 40 as well as an edge part 48 formed in the rear surface 45 of the main frame 40. The front edge part 47 in turn comprises straight edge portions 50 and 51 extending vertically in the Z1–Z2 direction on the X1 side as well as semicircular portions 52 and 53 on the Z1 and Z2 ends, respectively, of the straight edge portions 50, 51 and connected smoothly (that is, without angles) to the straight edge portions 50, 51. The edge part 48 is similarly formed, smoothly and without angles.

The electrically conductive seal member 60 described above has a thickness C of approximately 1 mm, and covers all surfaces of the main frame 40 except the peripheral side surfaces. In other words, the electrically conductive seal member 60 covers the front surface 44 and the rear surface 45 of the main frame 40 as well as the inner peripheral surfaces of the oblong opening 43. An electrically conductive seal member part 60c covers every surface of each of the vertical panes 42. It should be noted that electrically conductive seal member part 60c, which covers the vertical panes 42, is formed as a single piece with an electrically conductive seal member part 60a that covers the front surface 44 of the main frame 40 and an electrically conductive seal member part 60b that covers the rear surface 45 of the main frame 40.

Reference numeral 61 is an electrically conductive rubber flange that functions as a seal member, and forms a single integrated unit together with the electrically conductive seal member 60. With respect to the oblong opening 43, the flange 61 extends into the interior of the oblong opening 43 by a length D of approximately 2 mm from the front surface 44 edge portion 47, and is continuous with the entire surface of the opening edge portion 47. The electrically conductive flange 61 is oblong in shape, with no sharp edges, and, moreover, is completely continuous, without notches. The direction in which the portion of the flange 61 that projects into the interior space of the oblong opening 43 does so is parallel to the front surface 44 of the main frame 40.

Reference numeral 62 is an electrically conductive rubber flange that functions as a seal member, and forms a single integrated unit together with the electrically conductive seal member 60. With respect to the oblong opening 43, the flange 62 extends into the interior of the oblong opening 43 by a length E of approximately 2 mm from the rear surface 45 edge portion 48, and is continuous with the entire surface of the opening edge portion 48. The electrically conductive flange 62 is oblong in shape, with no sharp edges, and, moreover, is completely continuous, without notches.

Reference numeral 63 is an electrically conductive rubber flange that functions as a seal member, and forms a single integrated unit together with the electrically conductive seal member 60 that covers the rear surface 45 of the main frame 40. The flange 63 projects from a peripheral portion of the main frame 40 toward an interior thereof for a distance F equal to approximately 2 mm at an angle of approximately 45 degrees with respect to a plane perpendicular to the rear surface 45. The flange 63 is continuous across the entire periphery of the main frame 40.

As shown in FIG. 6B, the frame member 29 is fixedly mounted on the front surface of the BWB 28 by a plurality of screws (such screws not, however, shown in the diagram) along the frame 41, in such a way that the flanges 62 and 63 closely contact the frame ground layer 32. As a result, the frame member 29 is electrically grounded via the electrically conductive flanges 62, 63, the BWB 28 frame ground layer 32, the via holes VH, the BWB 28 frame ground layer 33 and the ground wire GW, acquires the frame ground electric potential and thus functions as an electromagnetic shield.

When the frame member 29 is fixedly mounted on the front surface of the BWB 28, air in a flat space on the rear surface 45 of the frame member 29 between the electrically conductive rubber flange 62 and surrounded by the electrically conductive rubber flange 63 is pushed outward, creating a vacuum in such space that suctionally attaches the frame member 29 to the BWB 28.

As shown in FIG. 6B, the individual sheet connectors 34 are accommodated with the spaces 46.

Additionally, as shown in expanded form in FIG. 6B, the electrically conductive rubber flange 62 is pressed against the frame ground layer 32 in an elastically deformed state, in such a way that no gap exists anywhere between the oblong opening 43 edge part 48 (the space 46) and the frame ground layer 32.

The above-described frame member 29 is constructed so that the main member thereof is the metal main frame 40, thus providing the frame member 29 with a rigid structure and allowing the frame member 29 to reinforce the BWB 28. Additionally, when the entire frame member 29 is composed of electrically conductive rubber, the electrical resistance between the front surface 44 and the rear surface 45 increases, with the result that it can be difficult to drop the electric potential of a metal case 80 of the mounted plug-in unit 70 to be described later to the frame ground electric potential. However, because the main part of the frame member 29 is the metal main frame 40, the electrical resistance between the front surface 44 and the rear surface 45 is approximately the same low value as a case in which the entire frame member 29 itself is made of metal, thus making it possible to drop the electric potential of the metal case 80 of the mounted plug-in unit 70 to be described later to the ground electric potential.

The above-described electrically conductive seal member 60 and electrically conductive rubber flanges 61, 62 are set within a mold used to form the main frame 40 of the frame member 29 so that a gap is formed between the main frame 40 and an interior surface of the casting mold. Thereafter the electrically conductive rubber is injected into the gap in an insert coating process.

A description will now be given of the shell-type plug-in unit 70.

Figure 7:
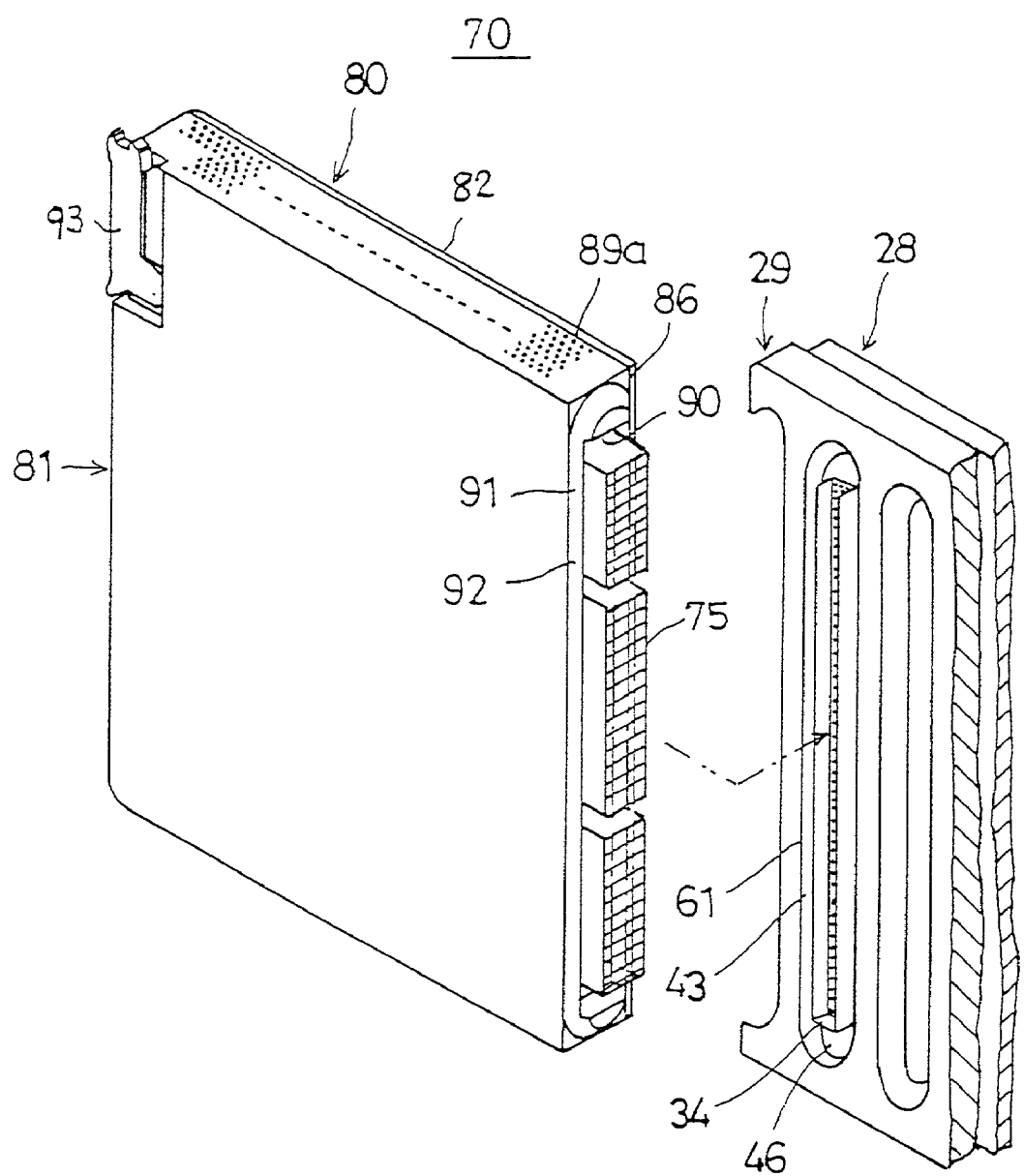
FIG. 7 is a rear oblique view of a shell-type construction plug-in unit.
Figure 8:
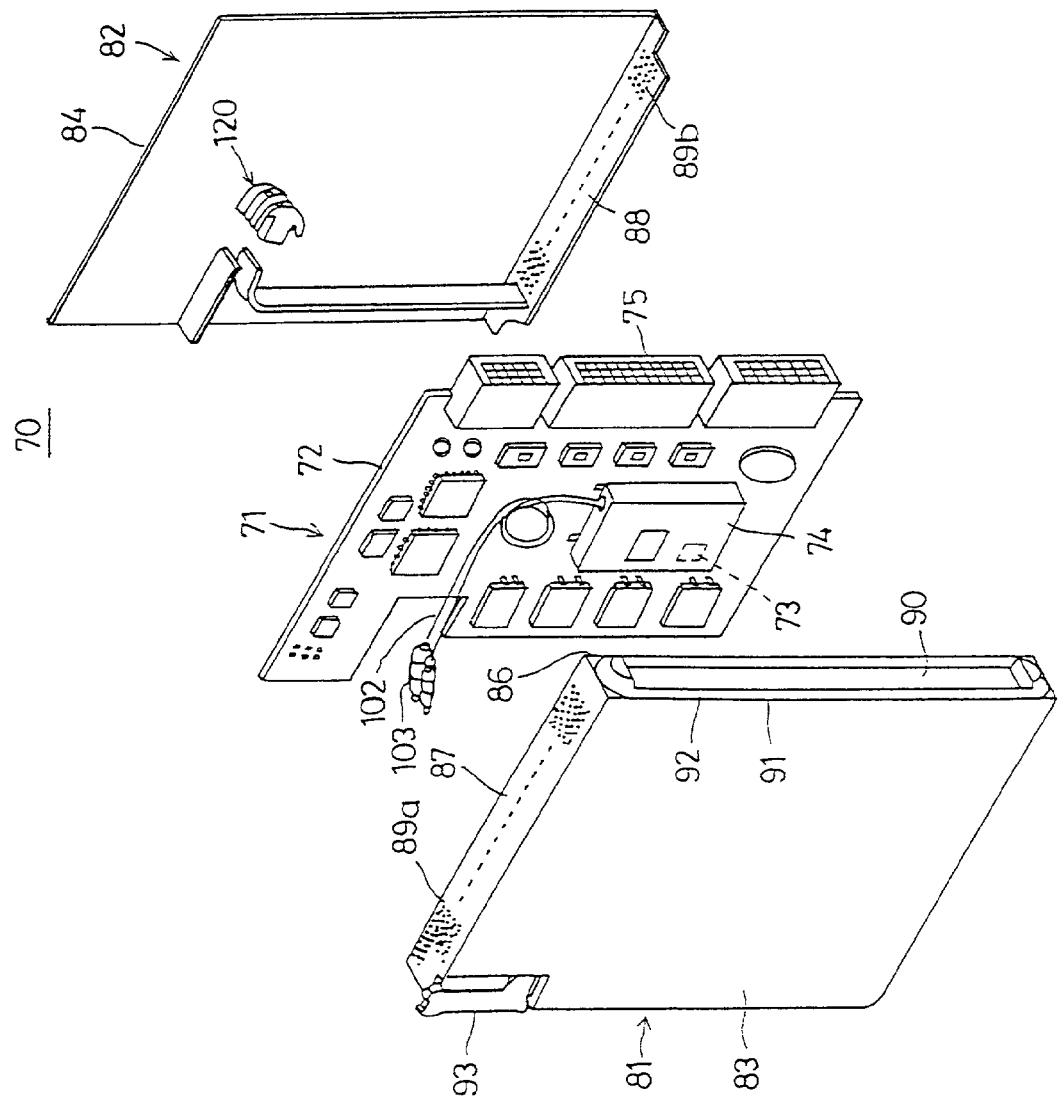
FIG. 8 is an exploded perspective view of a shell-type construction plug-in unit.

FIG. 7 is a rear oblique view of a shell-type construction plug-in unit. FIG. 8 is an exploded perspective view of the shell-type construction plug-in unit. FIGS. 9A, 9B, 9C and 9D are diagrams showing top, left lateral, rear and right lateral views, respectively, of the shell-type construction plug-in unit.

As shown in the diagrams, the plug-in unit 70 encloses the printed wiring board assembly 71 inside an aluminum shell or casing 80.

The printed wiring board assembly 71 comprises a printed wiring board 72 mounting an oscillator 73, a photoelectric conversion element module 74, and the like. A connector 75 which functions as the connector for the plug-in unit is mounted on a Y1 edge of the printed wiring board 72.

The metal casing 80 is an assembly of a first metal casing half 81 and a second metal casing half 82, and has left and right lateral side surfaces 83, 84, a front surface 85, a rear surface 86, a top surface 87 and a bottom surface 88.

A plurality of small holes 89a are formed in the top surface 87 of the metal casing 80 for the purpose of admitting forced air into the interior of the casing so as to cool the interior. Similarly, a plurality of small holes 89b are also formed in the bottom surface 88 of the metal casing 80 for identical cooling purposes.

The size of the holes 89a and 89b are such that their diameter d is 3 mm and their depth t is 6 mm, such dimensions being determined with reference to the cut-off frequency and the shielding effect.

The cut-off frequency fc is expressed as $$fc=0.272 \times 10^9/\text{hole diameter (mm)}$$

In other words, the cut-off frequency fc is determined by the diameter of the holes. For example, if the hole diameter is 3 mm, the fc is 58.4 GHz, there is a shielding effect for frequencies at and below this frequency and the arrangement is effective for high 40 GHz oscillators as well.

Additionally, the size of the shielding effect of the air holes 89a, 89b is expressed as $$S=32 \times (t/d) \text{ dB}$$

The shielding effect of one air hole 89a is 64 dB. The fact that there are 524 holes 89a, 89b reduces the shielding effect as follows:

$$S=-20 \log \sqrt{504}=-27 \text{ dB}$$

Accordingly, even with the formation of air holes 89a, 89b in the metal casing 80 as described above, that casing still provides a relatively large shielding effect of 37 dB. Accordingly, the metal casing 80 exhibits fully adequate EMC.

It should be noted that the shielding effect can be increased above 37 dB by increasing the thickness t of the top surface 87 and the bottom surface 88 of the metal casing 80 beyond 6 mm.

Additionally, it should be noted that an opening 90 extends across approximately the entire rear surface 86 of the metal casing 80, with the above-described connector 75 projecting from the opening 90 in the Y1 direction.

Additionally, the rear surface 86 of the metal casing 80 is provided with a substantially oblong-shaped banked portion 91 on an inner periphery of the rear surface 86. A tapered surface 92 is provided on an outer side of this oblong-shaped banked portion 91, and has a size which corresponds to the size of the oblong openings 43.

Figure 10:
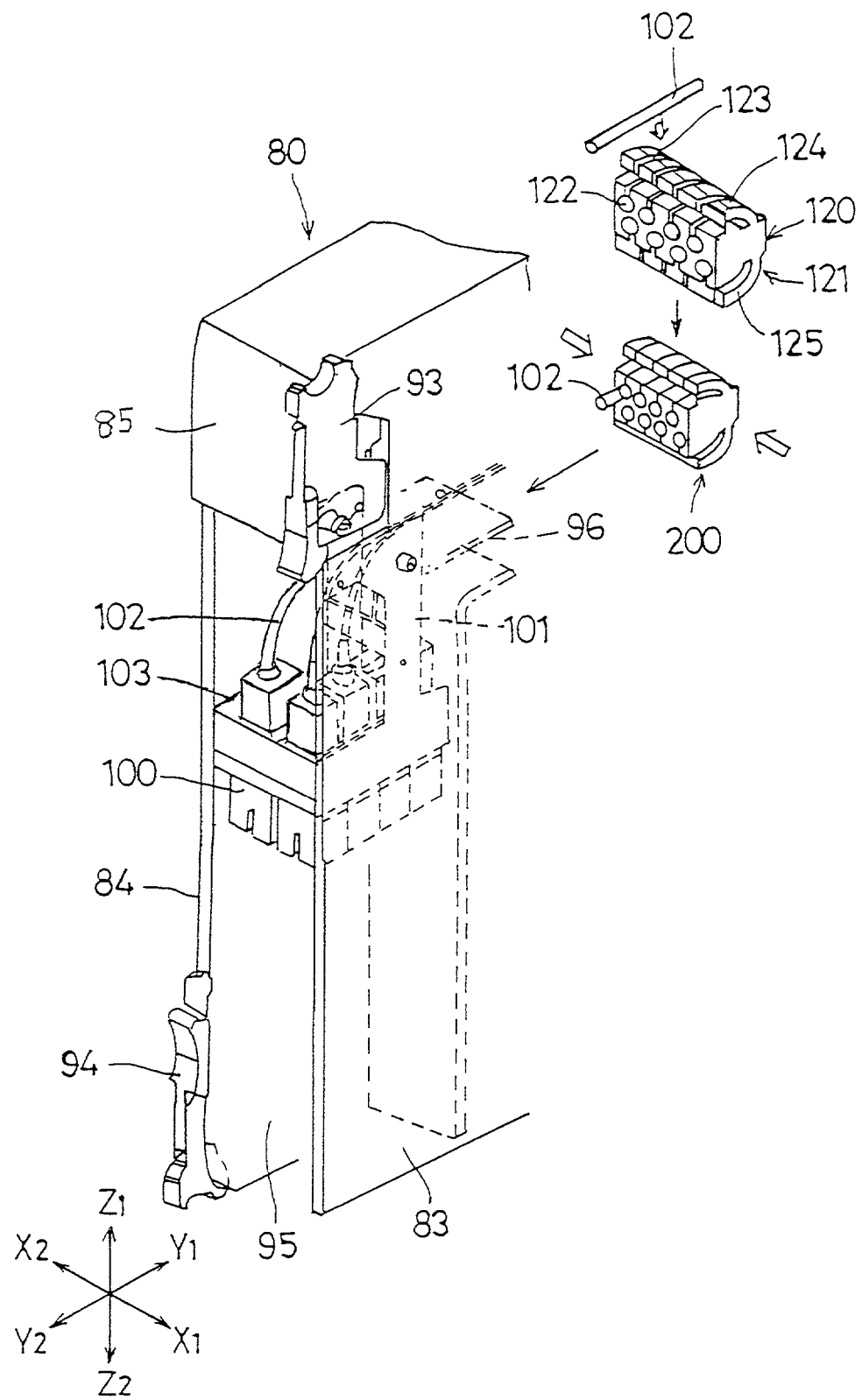
FIG. 10 is a diagram showing a front view of the construction of a shell-type plug-in unit.

FIG. 10 is a diagram showing a front view of the construction of a shell-type plug-in unit.

As shown in FIG. 10, card levers 93 and 94 are mounted on top and bottom edges of the front surface 85 of the metal casing 80.

Additionally, the front surface 85 of the metal casing 80 has a concavity 95, with an opening 96 formed in an interior portion of the concavity 95.

A plurality of adapters 100 for connecting optical connectors are provided so as to be rotatably supported by supporting member 101. A plug 103 at a tip of an optical fiber 102 extending from an outer side of the metal casing 80 through the above-described opening 96 in the interior of the metal casing 80 is connected to an upper side of the optical connector adapter 100.

A plug 111 at a tip of an optical fiber 110 extending from an external unit as shown in FIGS. 9B and 9C after the plug-in unit 70 has been mounted in the subrack 21 is connected to a bottom side of the optical connector adapter 100.

As shown in FIG. 10, reference numeral 120 indicates an optical fiber seal member. The optical fiber seal member 120 is provided at the above-described opening 96 and is configured so that an electrically conductive rubber block 121 is provided with two rows of alternating through-holes 122 having a diameter slightly larger than that of the optical fiber, and further, a slit 123 extends from each such through-hole 122 to top and bottom surfaces of the block 121. Arm portions 124, 125 project from the top and bottom surfaces, respectively, of the block 121.

By varying the block 121 as appropriate and inserting the optical fiber 102 through the slit 123 and into the through-hole 122, then in a state in which the block 121 is compressed from horizontal left and right lateral sides in the X1–X2 direction, the arm portions 124, 125 engage the edges of the opening 96 and are mounted thereon. No gap arises between each individual through-hole 122 and optical fiber 102. Accordingly, inside the opening 96 the portion between adjacent optical fibers 102 is completely sealed by the optical fiber seal member 120.

As described above, the plug-in unit 70 is constructed so as to restrict the leakage of electromagnetic radiation from the opening 96.

A description will now be given of a state in which the plug-in unit 70 is mounted in the subrack 21.

Figure 11:
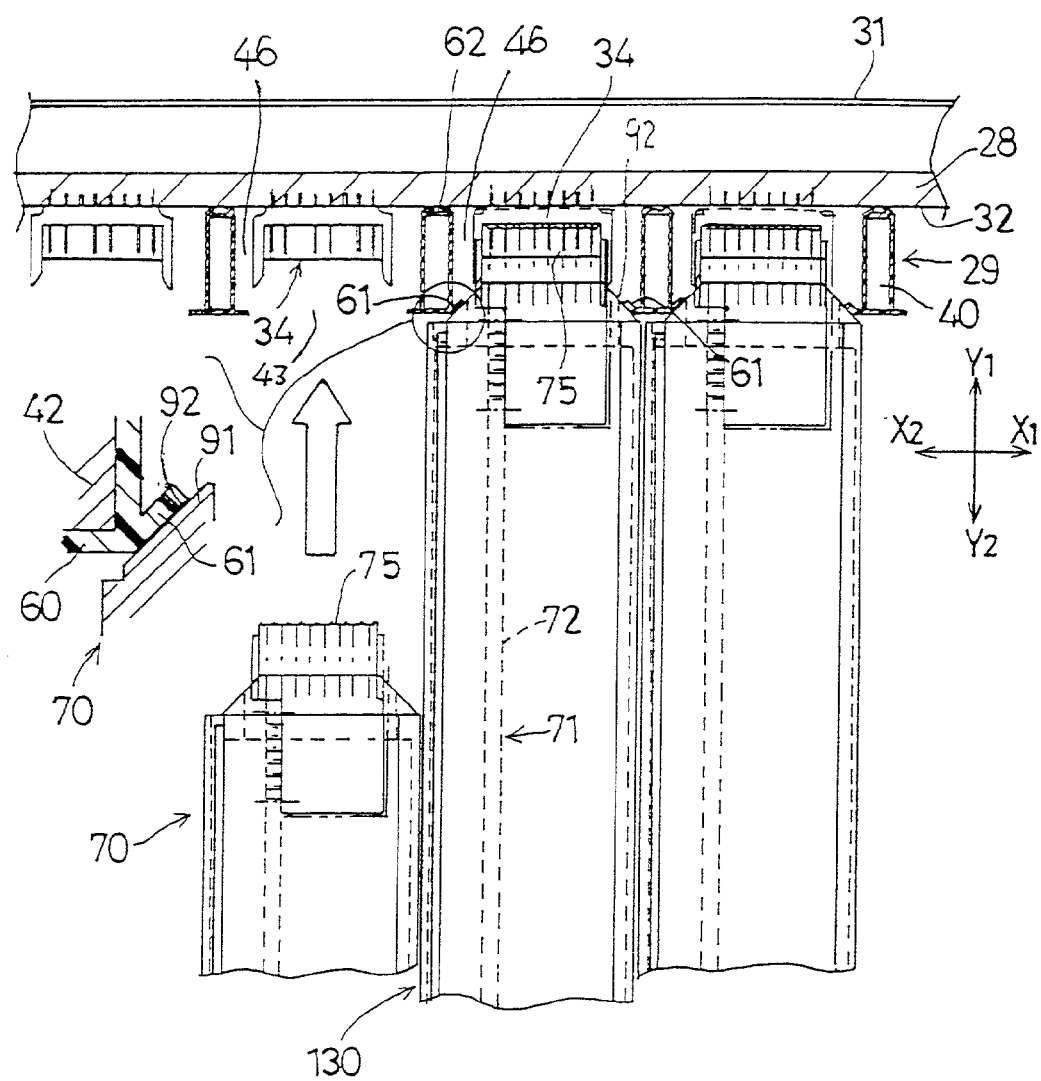
FIG. 11 is a diagram showing a top view of a state in which a shell-type plug-in unit is mounted in a subrack.

FIG. 11 is a diagram showing a top view of a state in which a shell-type plug-in unit is mounted in a subrack.

As shown in FIGS. 2 through 11, the plug-in unit 70 is inserted in the subrack 21 by a operator who takes the plug-in unit 70 and pushes it into the interior of the subrack 21 in the Y1 direction using the guide rail portions 24, 25. By pushing the card levers 93, 94 described above inward in the Y1 direction, the connector 75 is connected to the sheet connector 34, thus mounting the plug-in unit 70 in the subrack 21.

As shown in FIG. 11, the oblong-shaped banked portion 91 on the rear surface 86 of the metal casing 80 engages the oblong opening 43 in the frame member 29, in a state of contact with the electrically conductive rubber flange 61. As a result, the metal casing 80 of the plug-in unit 70 is electrically connected to the ground via the electrically conductive rubber flange 61, the main frame 40, the electrically conductive rubber flanges 62, 63, the BWB 28 frame ground layer 32, the via holes VH, the BWB 28 frame ground layer 33 and the ground wire GW, thus acquiring the frame ground electric potential and therefore functioning as an electromagnetic shield.

Additionally, the connector 75 connected to the sheet connector 34 is accommodated within the space 46 inside the oblong opening 43 in the frame member 29.

A description will now be given of the relation between the metal casing 80 and the frame member 29.

As shown in enlarged fashion in FIG. 11, the tapered surface 92 of the oblong banked portion 91 of the metal casing 80 presses against the electrically conductive rubber flange 61, the electrically conductive rubber flange 61 elastically deforms so as to bend in the Y1 direction, and the tapered surface 92 contacts the electrically conductive rubber flange 61 across the entire periphery of the tapered surface 92. The elastic deformation of the electrically conductive rubber flange 61 accommodates any undulations in the surface of the tapered surface 92. As a result, no gap arises anywhere along the entire periphery of the tapered surface 92. Additionally, the oblong-shaped banked portion 91 has no sharp angles, thereby further ensuring that there are no gaps.

As a result, in a state in which the plug-in unit 70 is mounted in the subrack 21, the metal casing 80 of the plug-in unit 70, the portion of the frame member 29 that corresponds to the plug-in unit 70, and the portion of the BWB 28 that corresponds to the plug-in unit 70 together form a single box 130. The box 130, which has the frame ground electric potential, accommodates within it the connector 75 connected to the printed wiring board assembly 71 and the sheet connector 34, covering the printed wiring board assembly 71 and the sheet connector 34. As a result, the box 130 with an interior space is a nearly hermetically sealed conductor and forms a grounded Faraday cage.

The elastically deformed electrically conductive rubber flange 61 ensures that no gap appears between the metal case 80 and the frame member 29. Similarly, the elastically deformed electrically conductive rubber flange 62 ensures that no gap arises between the frame member 29 and the BWB 28. As a result, the portion between the metal casing 80 and the frame member 29 and the portion between the frame member 29 and the BWB 28 exhibit fully adequate EMC, such that even at ultrahigh electromagnetic frequencies of 40 GHz any leakage from or seepage in of electromagnetic radiation is securely prevented, and further, any leakage from or seepage in of electromagnetic radiation via the space between the frame member 29 and the BWB 28 is securely prevented.

As a result, in a state in which the plug-in unit 70 is mounted in the subrack 21, the 40 GHz electromagnetic radiation from the printed wiring board assembly 71 is contained within the box 130, thus securely preventing leakage outside the box 130. Additionally, seepage into the box 130 of 40 GHz electromagnetic radiation from external sources is also securely prevented.

Additionally, the tapered surface 92 of the oblong banked portion 91 serves to guide the oblong banked portion 91 into the oblong opening 43 in the frame member 29. As a result, the tapered surface 92 is guided along the edge of the oblong opening 43 so as to securely mount the plug-in unit 70 in the subrack 21.

Additionally, the electrically conductive flange 61 elastically deforms unevenly so as to absorb dimensional tolerances in the guide rail members 24, 25 and the frame member 29, as well as dimensional tolerances between the guide rail member 24 and the frame member 29.

Additionally, when the connector 75 is connected to the sheet connector 34, a force acts against the BWB 28 in the Y1 direction and the BWB 28 tends to bulge in the Y1 direction. However, because the frame member 29 is suctionally attached to the BWB 28, the BWB 28, where not stopped by screws, such as for example in a central portion, is reinforced by the frame member 29 and thus the BWB 28 does not bulge as described above.

A description will now be given of a telecommunications apparatus according to a second embodiment of the present invention, with reference to the accompanying drawings.

Figure 12:
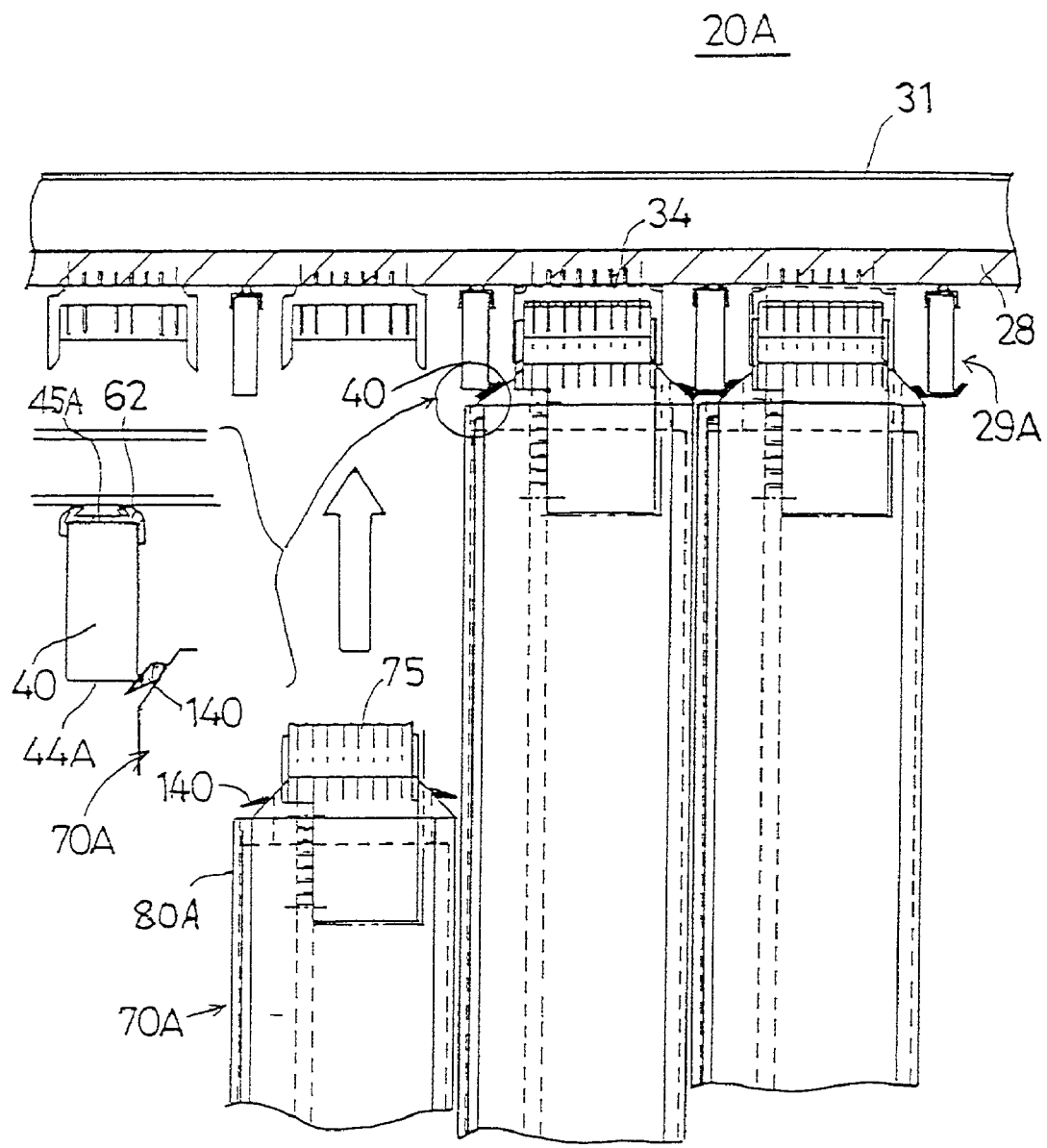
FIG. 12 is a diagram showing a telecommunications apparatus according to a second embodiment of the present invention.

FIG. 12 is a diagram showing a telecommunications apparatus according to a second embodiment of the present invention.

As shown in the diagram, the telecommunications apparatus 20A comprises a BWB 28, a frame member 29A, and a plug-in unit 70A.

The frame member 29A has the electrically conductive rubber flange 62 provided on a rear surface 45A. A front surface 44A is configured so that the main frame 40 is exposed.

The plug-in unit 70A is configured so that an oblong-shaped electrically conductive rubber flange 140 is positioned on a rear surface of an aluminum case 80A in such a way as to surround the connector 75, being attached thereto by an electrically conductive adhesive.

In a state in which it is mounted in the subrack 21, the plug-in unit 70A elastically deforms the electrically conductive rubber flange 140 so as to cause the flange 140 to contact the main frame 40, thus leaving or creating no gap. As a result, between the aluminum case 80A and the frame member 29A there exists fully adequate EMC.

Figure 13:
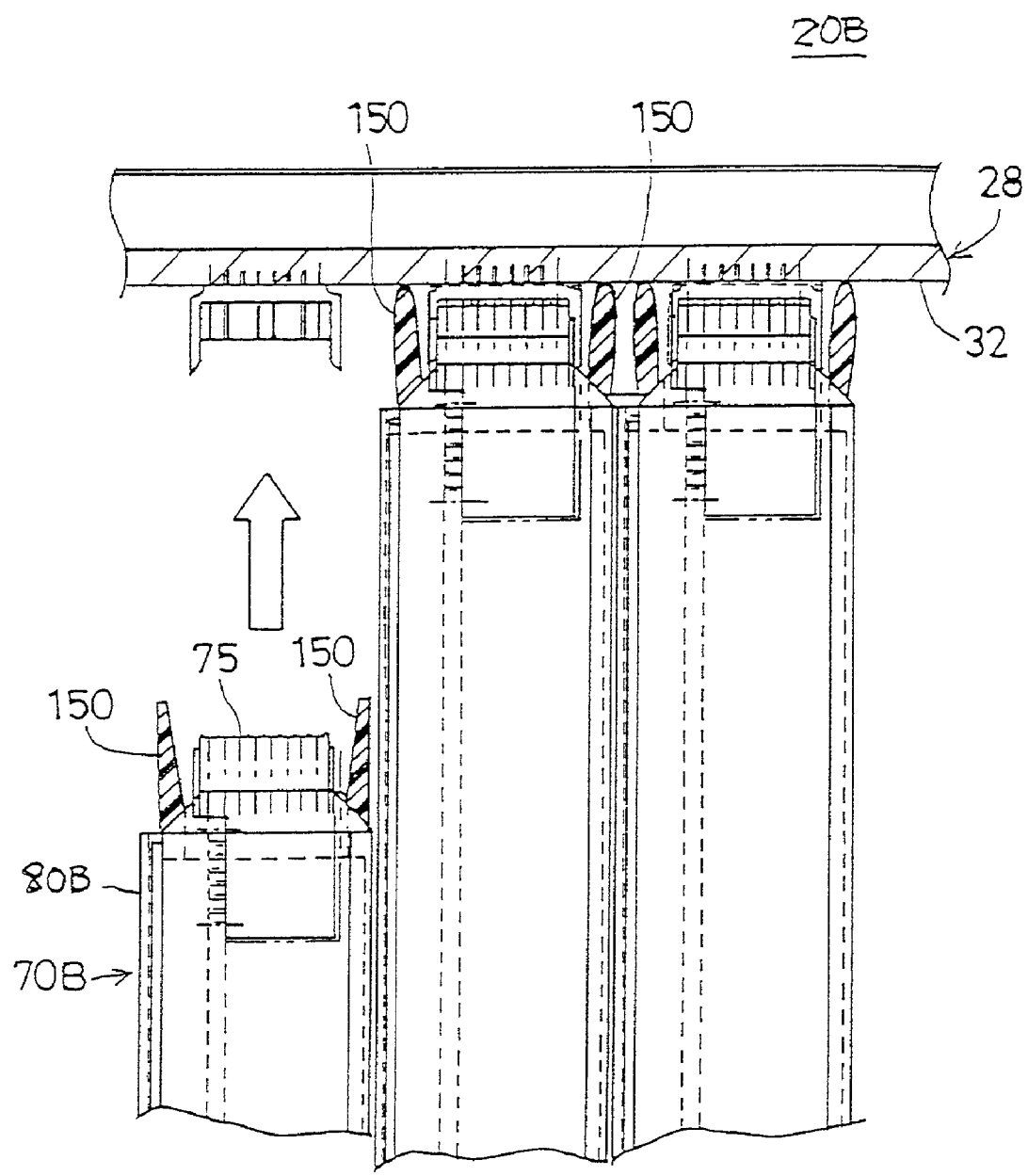
FIG. 13 is a diagram showing a telecommunications apparatus according to a third embodiment of the present invention.

FIG. 13 is a diagram showing a telecommunications apparatus according to a third embodiment of the present invention.

As shown in the diagram, the telecommunications apparatus 20B comprises the BWB 28 and a plug-in unit 70B, but no frame member.

The plug-in unit 70B is configured so that an oblong-shaped electrically conductive rubber flange 150 is positioned on a rear surface of an aluminum case 80B in such a way as to surround the connector 75, being attached thereto by an electrically conductive adhesive.

In a state in which it is mounted in the subrack 21, the plug-in unit 70B elastically deforms a tip part of the electrically conductive rubber flange 150 so as to cause the tip part of the flange 150 to contact the frame ground layer 32 of the front surface of the BWB 28, thus leaving or creating no gap. As a result, between the aluminum case 80B and the BWB 28 there exists fully adequate EMC.

It should be noted that the above-described coating 60 and flanges 61, 62, 63, 140 and 150 may be composed of an electrically conductive elastomer impregnated with metallic filler or carbon instead of the electrically conductive rubber described above, or alternatively, an electrically conductive sponge material consisting of sponge impregnated with metallic filler or carbon, or alternatively, an electrically conductive gel rubber material consisting of gel rubber impregnated with metallic filler or carbon. Additionally, the coating 60 and the flanges 61, 62, 63, 140 and 150, whether made of rubber, elastomer, sponge or gel rubber, may be coated with a metallic coating, or alternatively, be composed of an electrically conductive silicon rubber or dispenser gasket and still achieve the same effect as described above.

Figure 14:
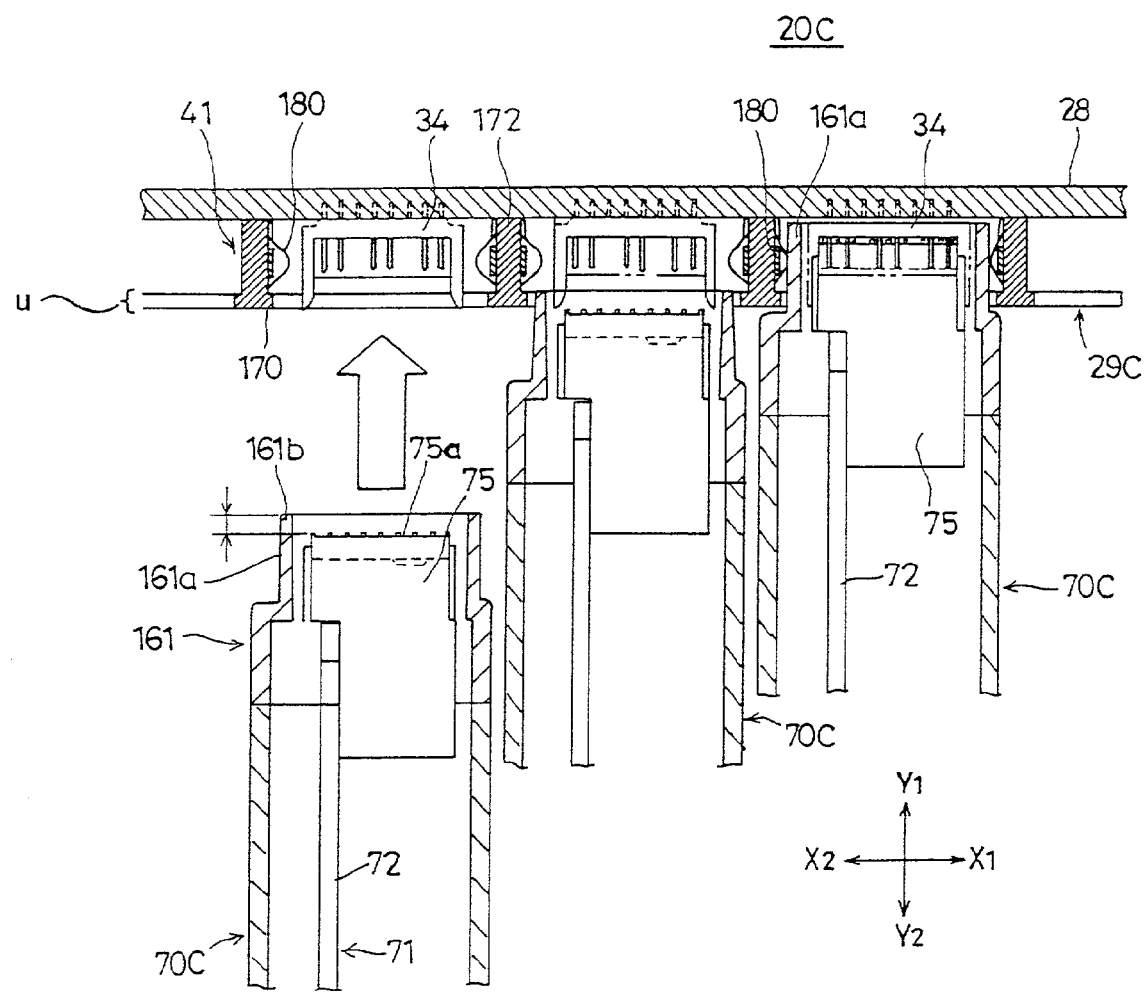
FIG. 14 is a diagram showing a telecommunications apparatus according to a third embodiment of the present invention.

FIG. 14 is a diagram showing a telecommunications apparatus according to a third embodiment of the present invention, shown in a state just prior to mounting in the subrack 21 and in a mounted state.

Figure 15:
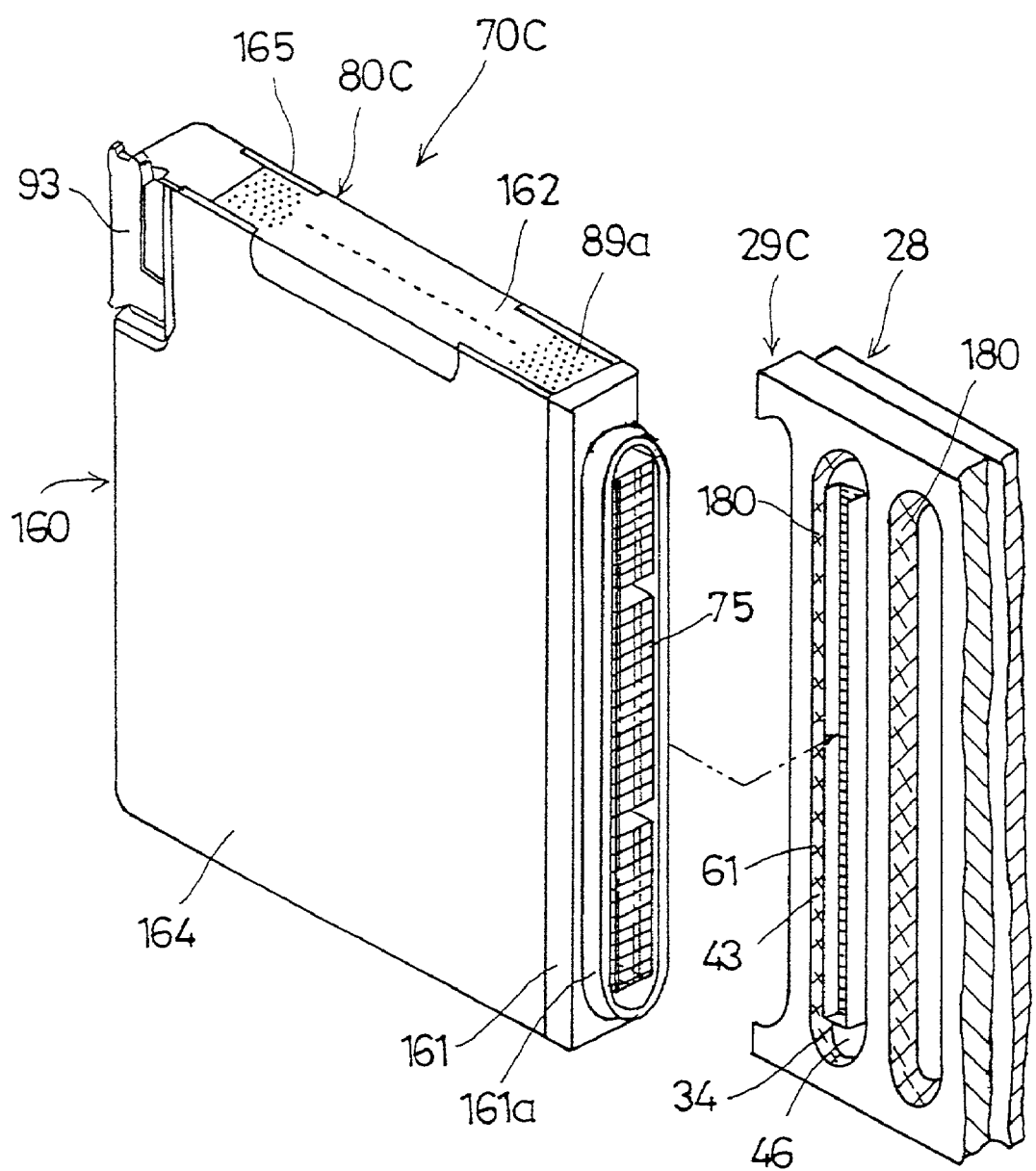
FIG. 15 is a diagram showing a perspective view of a shell-type plug-in unit and an interior portion of a subrack.

FIG. 15 is a diagram showing a perspective view of a shell-type plug-in unit and an interior portion of a subrack.

As shown in the diagrams, a telecommunications apparatus 20C comprises the BWB 28 mounting the sheet connector 34, a frame member 29C, a seal member 180 and a plug-in unit 70C.

Figure 16:
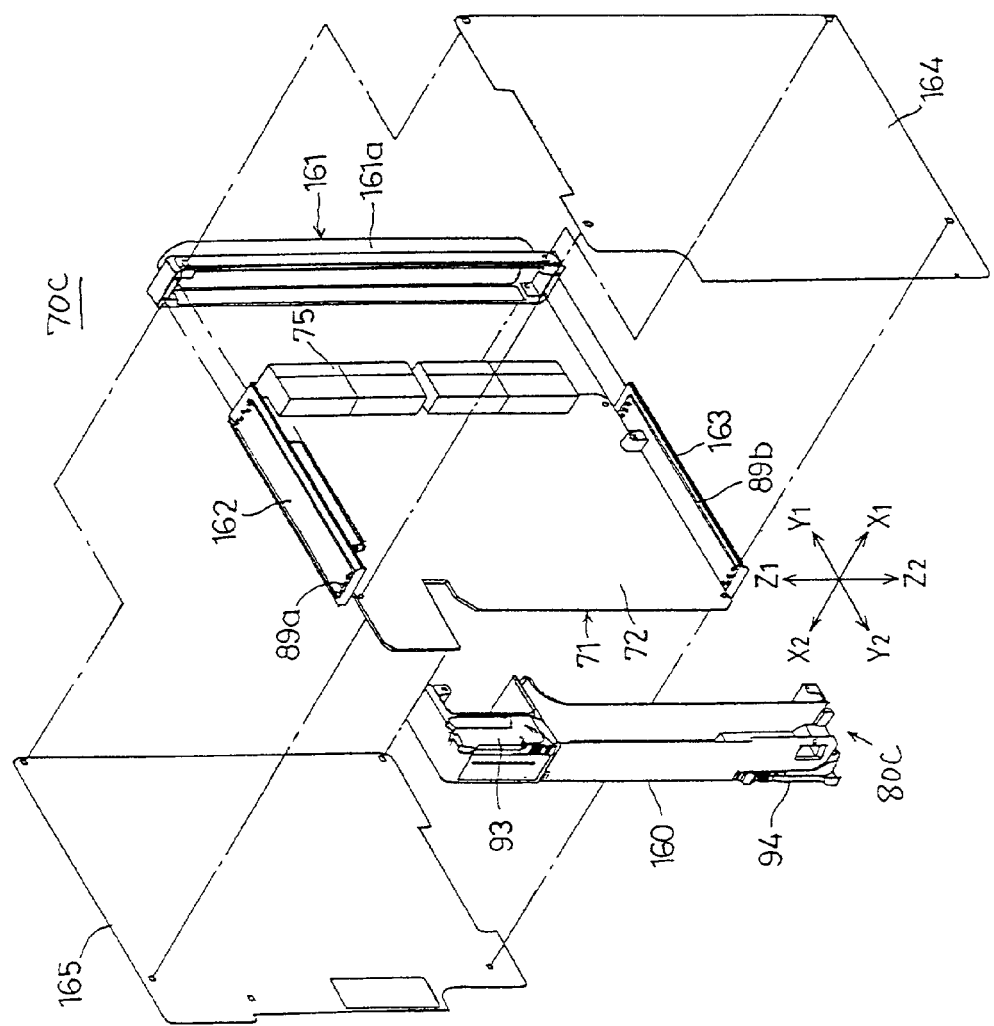
FIG. 16 is a diagram showing an exploded perspective view of a shell-type plug-in unit.

FIG. 16 is a diagram showing an exploded perspective view of a shell-type plug-in unit.

As shown in the diagram, the plug-in unit 70C is a shell-type plug-in unit, in which the printed wiring board assembly 71 is enclosed by an aluminum case 80C. The aluminum case 80C comprises a front surface panel part 160, a rear surface connector cover 161, an upper shield part 162 in which a plurality of holes 89a for the circulation of air are formed, a lower shield part 163 (not shown in the diagram) in which a plurality of holes 89b for the circulation of air are formed, a right lateral panel part 164 and a left lateral panel part 165.

Here, the front panel part 160, the upper shield part 162, the rear surface connector cover 161 and the lower shield part 163 are brazed together to form a four-sided frame. The left and right lateral parts 164 and 165, respectively, are screwed into place. The printed wiring board 72 is supported by the upper shield part 162 and the lower shield part 163.

The rear connector cover 161 is provided with an oblong cover portion 161a. The cover portion 161a is of an oblong shape that corresponds to the oblong openings 43 in the main frame 40 of the frame member 29, and of a size that accommodates the connector 75 and that fittingly engages the oblong openings 43 in the main frame 40 of the frame member 29. As shown in FIG. 14, an edge surface 161b in the Y1 direction of the cover portion 161a is positioned further in the Y1 direction than an edge surface 75a of the connector 75 by a length u.

The edge 161b of the cover portion 161a projects beyond the edge 75a of the connector 75, so the connector 75 is protected by the cover portion 161a. Thus, if during handling by a operator the plug-in unit 70C is accidentally dropped or inadvertently struck, the connector 75 is protected from damage by the cover portion 161a.

The front surface panel part 160, rear surface connector cover 161 and card levers 93, 94 are diecast products made of aluminum. In the event that the interior of the telecommunications apparatus 20C catches fire, the parts most susceptible to flame, that is, the upper shield part 162, the lower shield part 163, the right lateral panel part 164 and the left lateral panel part 165 are made of titanium. The melting point of titanium is 1675° C., that is, 660° C. higher than the melting point of aluminum. As a result, the plug-in unit 70C has greater fire resistance than when all the parts of the metal casing 80C are made of aluminum.

FIGS. 17A, 17B, 17C and 17D are diagrams showing perspective and partial views of a frame member.

Figure 17A:
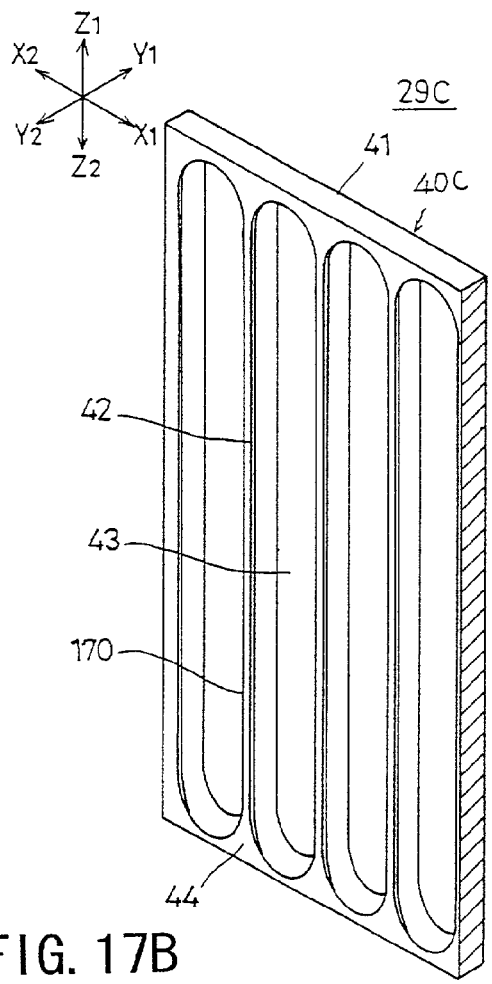
FIGS. 17A, 17B, 17C and 17D are diagrams showing perspective and partial views of a frame member.
Figure 17B:
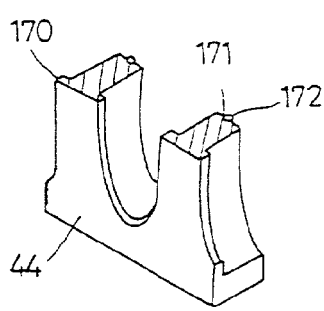
Figure 17C:
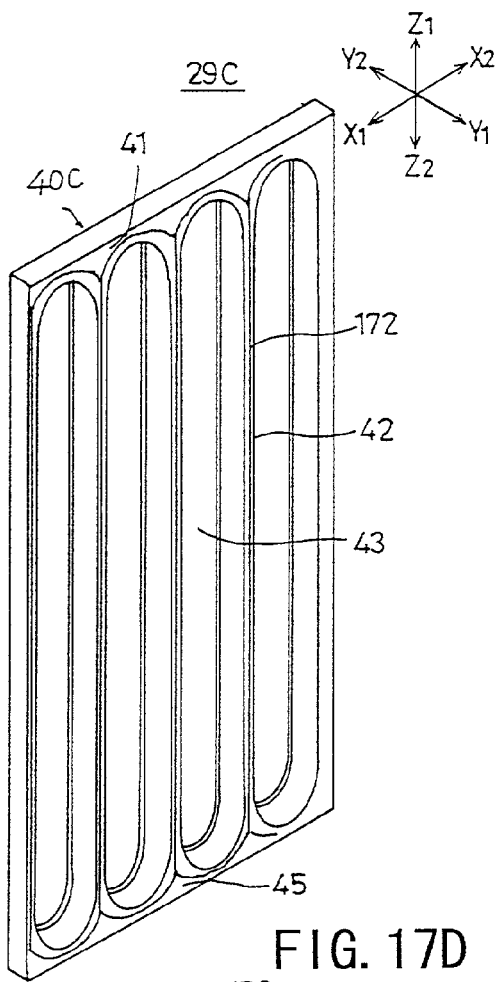
Figure 17D:
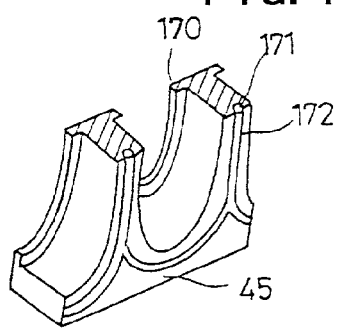

In particular, FIG. 17A shows a front view of the frame member, FIG. 17B shows an enlarged partial cross-sectional view of the frame member shown in FIG. 17A, FIG. 17C shows a rear view of the frame member and FIG. 17D shows an enlarged partial cross-sectional view of the frame member shown in FIG. 17C.

As shown in the diagrams, the frame member 29C comprises an aluminum diecast main frame 40C and slat members 172 composed of electrically conductive rubber.

The main frame 40C comprises a frame 41, a plurality of vertical panes 42, and a plurality of oblong openings 43 formed by and between the vertical panes 42, extending vertically in the Z1–Z2 direction and aligned in parallel horizontally in the X1–X2 direction. A flange 170 is formed along an edge of the oblong openings facing a front surface 44. The flange 170 has the function of fixedly mounting a seal member 180 to be described later.

A groove 171 is formed on rear surfaces 45 of each of the vertical panes 42, along an entire periphery of the oblong opening 43. The slat members 172 composed of electrically conductive rubber fit into these grooves 171, and further, the slat members 172 composed of electrically conductive rubber, when so fitted to the grooves 171, project from the rear surfaces of the vertical panes 42. Additionally, the slat members 172 composed of electrically conductive rubber are provided so as to surround each of the oblong openings 43 and to connect to adjacent slat members 172 composed of electrically conductive rubber. The slat members 172 are formed from a dispenser used to fill the grooves, and because the slat members 172 project from the rear surface of the vertical panes 42 when the frame member 29C and the BWB 28 overlap and are fastened together by screws as shown in FIG. 14 the slat members 172 are compressed and closely contact the frame ground layer of the BWB 28, thus grounding the entire frame member 29C.

Figure 18A:
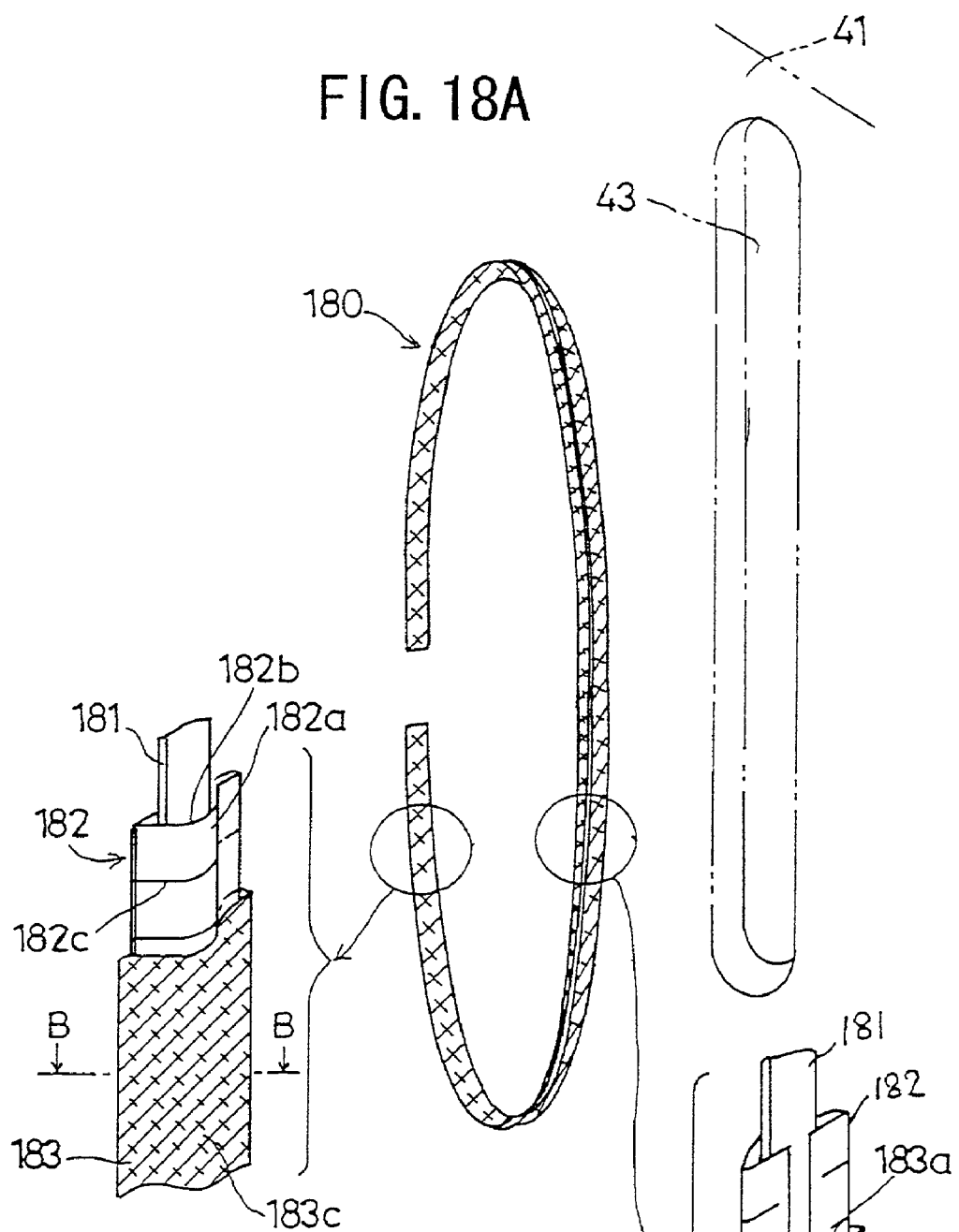
FIGS. 18A and 18B are diagrams showing partial and cross-sectional views, respectively, of a seal member.
Figure 18B:
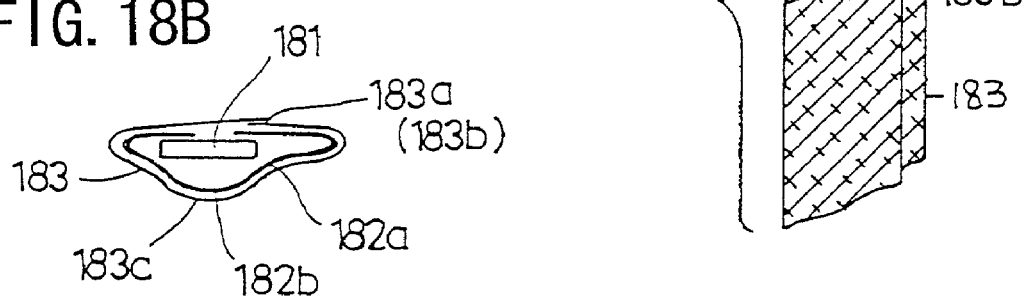
Figure 19:
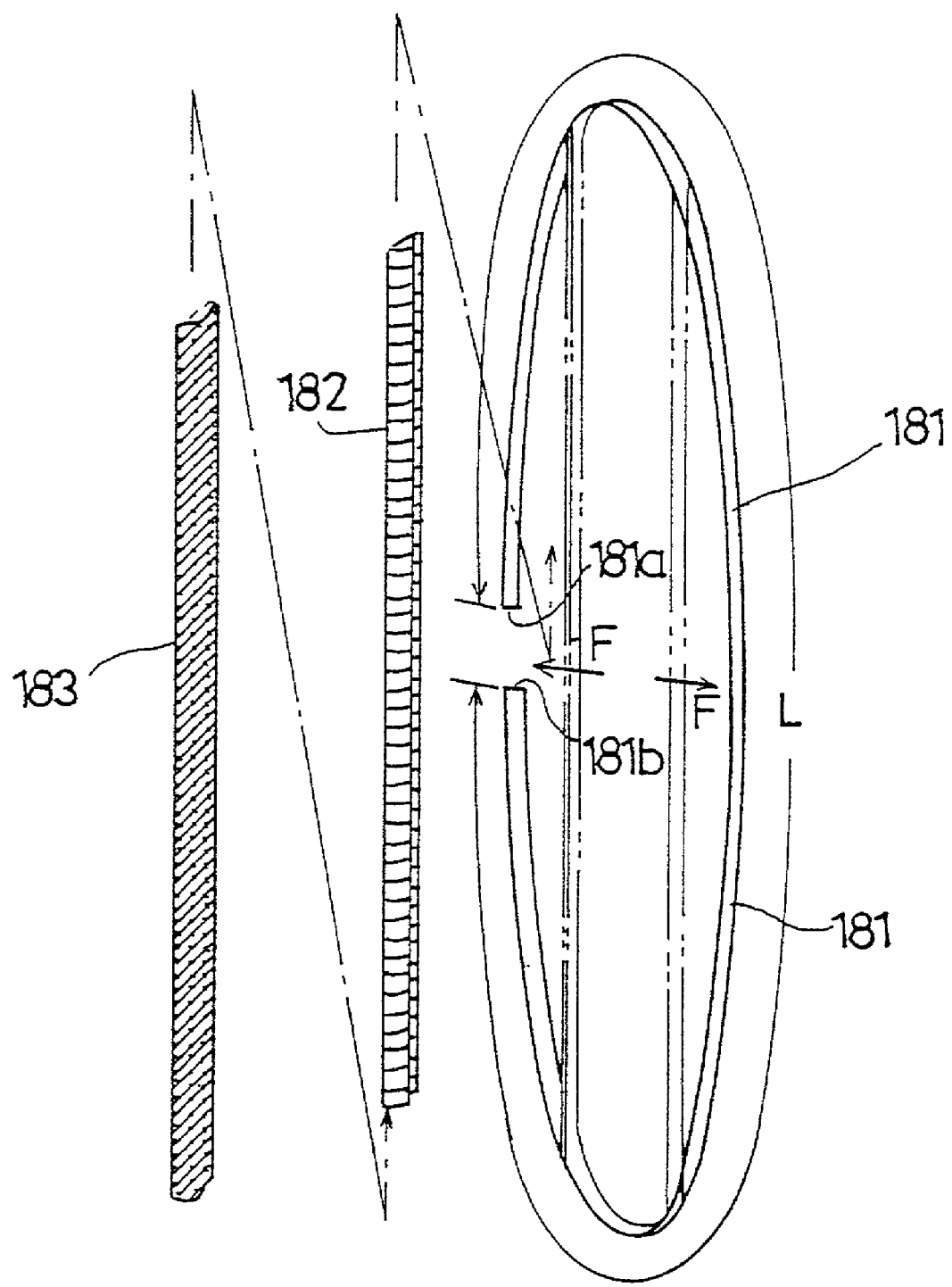
FIG. 19 is a diagram showing an exploded view of a seal member.

FIGS. 18A and 18B are diagrams showing partial and cross-sectional views, respectively, of a seal member. FIG. 19 is a diagram showing an exploded view of a seal member.

As shown in the diagrams, a seal member 180 comprises a core member 181, an anti-EMI finger gasket 182 and an electrically conductive cloth 183, and is shaped so as to conform to the oblong openings 43 in the main frame 40 of the frame member 29 described above.

The core member 181 is substantially a spring-like steel wire member having a substantially oblong shape corresponding to the oblong openings 43 and a length L equivalent to a length along an inner periphery of the oblong opening 43. Reference numerals 181a and 181b denote ends of the core member 181.

The finger gasket 182 is essentially a thin strip of phosphor bronze, notched into spring strips and folded in substantially the shape of a semicircle. Reference numeral 182a indicates a spring strip part of the finger gasket 182 and reference numeral 182b represents the curved portion of the semicircular part of the finger gasket 182.

The finger gasket 182 fittingly engages the core member 181 so as to cover the core member 181. At the same time, the core member 181 passes through an interior of the finger gasket 182. The curved portion 182b of the finger gasket 182 is positioned on an interior side of the oblong-shaped core member 181.

The electrically conductive cloth 183 is a woven cloth made of electrically conductive fiber formed in the shape of a strip and wrapped around the finger gasket 182 in such a way that the edges of the electrically conductive cloth 183 overlap, with the overlapping portions 183a having an adhesive portion 183b. Reference numeral 183c is a bulge portion, and is continuous along an inner periphery of the oblong-shaped seal member 180.

The core member 181 forms the core of the seal member 180, and by being elastically deformed exerted in a constricting direction forms the seal member 180 into the same shape as the opening 43. At the same time, a spring force F acts to press the seal member 180 against the inner peripheral surface of the opening.

The spring strips 182a of the finger gasket 182 retain their spring force even when deformed, that is, the electrically conductive cloth 183 is elastically deformed outward.

The electrically conductive coating 183 covers the gaps 182c between adjacent spring strips 182a of the finger gasket 182 so as to prevent the spring strips 182a from breaking off and injuring the operator when the operator mounts the seal member 180 on the mainframe 40C.

The BWB 28, frame member 29C and seal member 180 are first forcibly deformed by the core member 181 so that the seal member 180 assumes the same shape as the opening 43, the seal member being inserted into the opening 43 from the rear surface 45 of the main frame 40C until it contacts the flange 170 and the entire seal member 180 is attached to the opening 43 and the BWB 28 is fastened by screws to the rear surface of the frame member 29C.

The seal member 180 is pressed against the entire inner peripheral surface of the opening 43 by the spring force F exerted by the Core member 181 in an outward direction, with a displacement n the Y2 direction restricted by the flange 170 and a displacement in the Y1 direction restricted by the BWB 28. In other words, the seal member 180 is attached to the frame member 29C without the use of an adhesive, with the bulge portion 183c of the seal member 180 in continuous contact with the inner peripheral surface of the opening 43.

The slat members 172 composed of electrically conductive rubber are compressed and contact the frame ground layer of the BWB 28. As a result, the individual vertical panes 42 are reduced to ground potential. Additionally, the sheet connectors 34 are positioned inside each of the openings 43.

A description will now be given of the mounting of the plug-in unit 70C in the subrack, with reference to FIG. 14.

As a first stage, an operator inserts the plug-in unit 70C in the subrack 21 in the Y1 direction, until the plug-in unit 70C almost reaches a final position within the subrack 21. Next, as a second stage, the operator pushes the card levers 93, 94 inward in the Y1 direction. In FIG. 14, the left side shows an intermediate state of the first stage, the center shows a state of completion of the first stage and the right side shows a state of completion of the second stage.

In the first stage, the cover portion 161a is provisionally fitted to the interior of the opening 43 in the frame member 29C, so that the connector 75 contacts the sheet connector 34. In the second stage, the connector 75 is connected to the sheet connector 34, so that the cover portion 161a advances into the interior of the opening 43 while an outer peripheral surface of the cover portion 161a depresses the bulge portion 183a of the seal member 180.

When all the spring strips 182a of the finger gasket 182 of the seal member 180 are collapsed, the seal member 180 is then sandwiched between the inner peripheral surface of the opening 43 and the outer peripheral surface of the cover portion 161a. The spring force of the depressed spring strips 182a of the finger gasket 182 causes the electrically conductive cloth 183 to extend across the entire outer periphery of the cover portion 161a continuously, without a gap therebetween. The restorative force of the spring strips 182a of the finger gasket 182 also causes the electrically conductive cloth 183 to extend across the entire inner peripheral surface of the opening 43, continuously and without a gap therebetween. As a result, the portion that consists of the connection between the connector 75 and the sheet connector 34 exhibits fully adequate EMC.

Moreover, the restorative force of the metallic spring strips 182 does not deteriorate with time but is instead retained over many years. As a result, the portion that consists of the connection between the connector 75 and the sheet connector 34 reliably exhibits fully adequate EMC over many years.

A brief description will now be given of first and second variations of the seal member 180.

Figure 20:
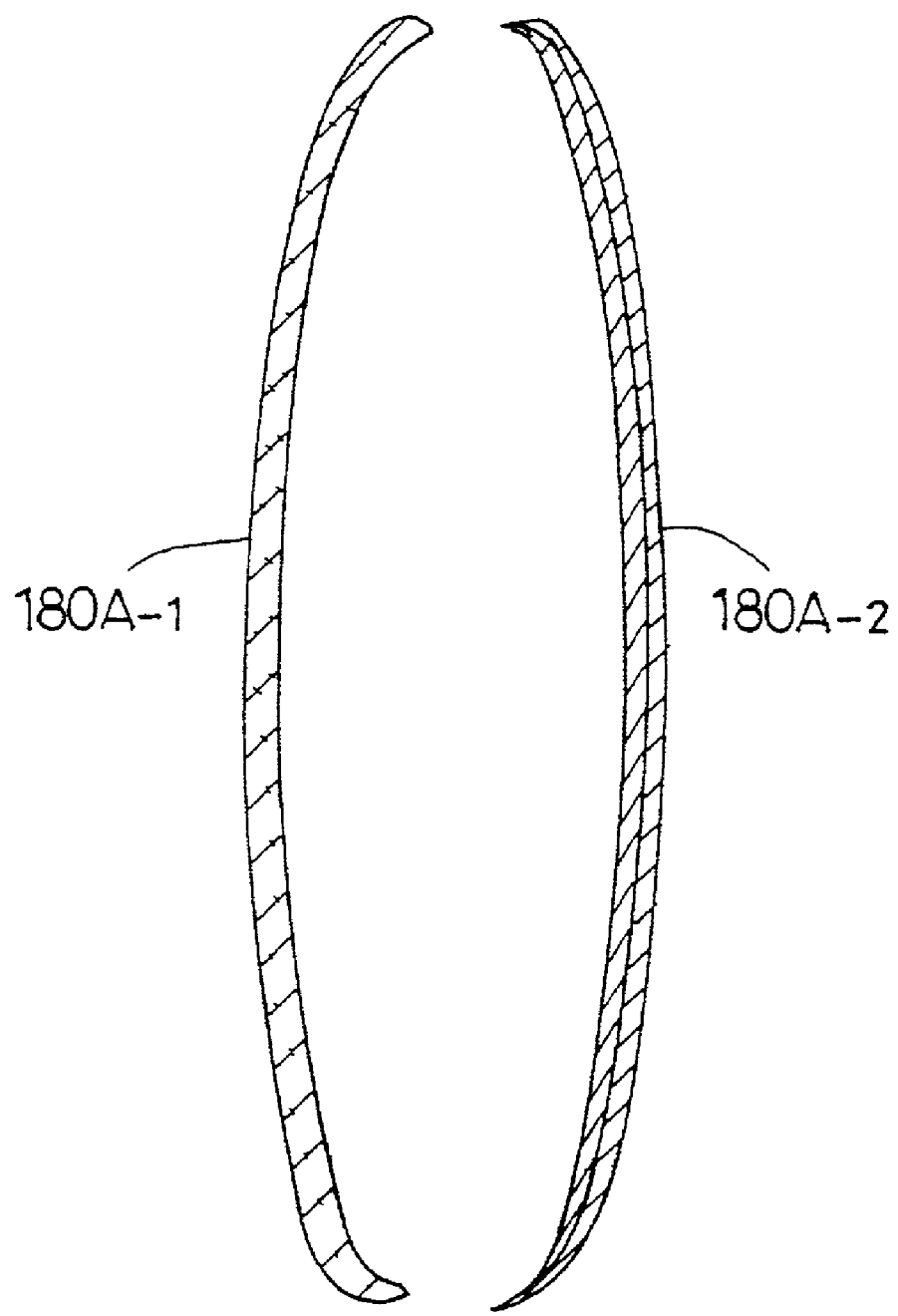
FIG. 20 is a diagram showing a first variation of a seal member.
Figure 21:
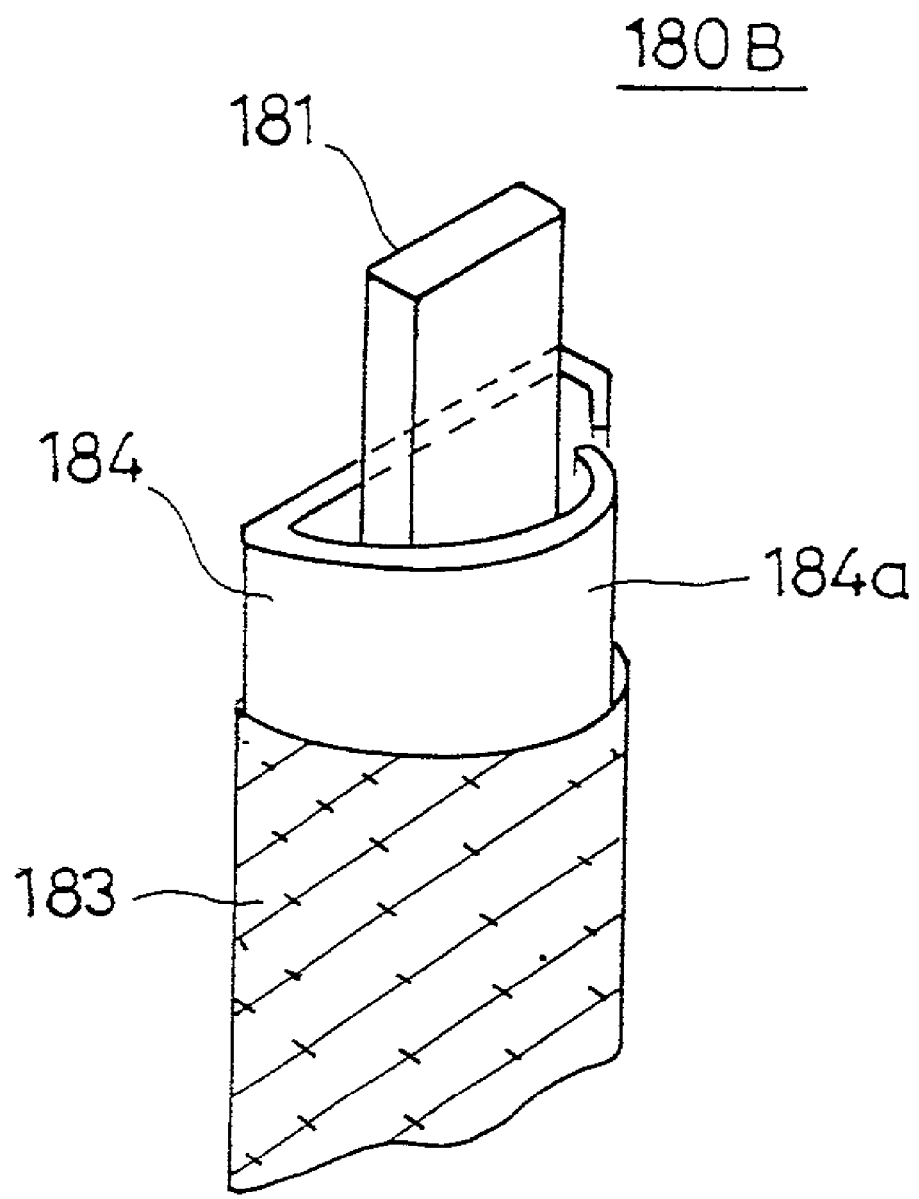
FIG. 21 is a diagram showing a second variation of a seal member.

FIG. 20 is a diagram showing a first variation of the seal member. FIG. 21 is a diagram showing a second variation of the seal member.

As shown in FIG. 20, a seal member 180A according to the first variation comprises two bow-shaped parts 180A-1 and 180A-2, both of which are fitted within the opening 43 in the frame member 29.

As shown in FIG. 21, a seal member 180B according to the second variation comprises a composite resin spring member 184 instead of the finger gasket 182 of the seal member 180. The spring member 184 has a semicircular cross-section and is partially notched, with a semicircular portion 184a elastically bent.

A description will now be given of a variation of the plug-in unit.

Figure 22:
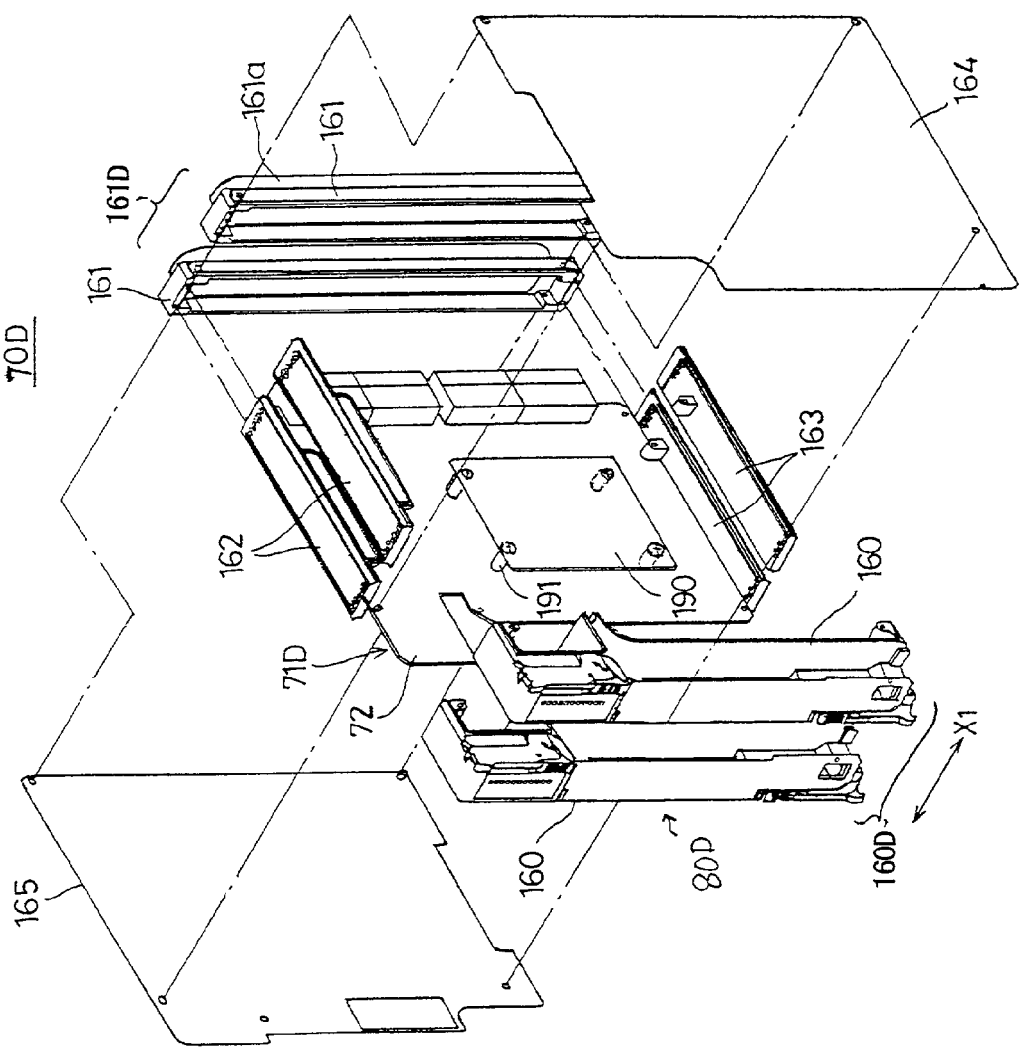
FIG. 22 is a diagram showing a perspective view of a variation of a plug-in unit.

FIG. 22 is a diagram showing a perspective view of a variation of a plug-in unit.

As shown in the diagram, a plug-in unit 70D comprises two of the plug-in units 70C described above aligned horizontally side by side, with the printed wiring board assembly 71D covered by a metal casing 80D. The metal casing 80D uses the same parts used to assemble the metal case 80C described above. That is, two front surface panel parts 160 are aligned and brazed together to form front surface panel part 160D, and similarly two rear surface connector covers 161D are aligned and brazed together to form a rear surface connector cover 161D. Two upper shield parts 162 in which a plurality of holes for the circulation of air are formed are aligned and brazed together to form upper shield part 162D, and similarly two lower shield parts 163 are aligned and brazed together to form lower shield part 163D. Additionally, the plug-in unit 70D also comprises left and right panel parts 164 and 165, respectively. The printed wiring board assembly 71D comprises the printed wiring board assembly 71 described above with the addition of an auxiliary printed wiring board 190. As shown in the diagram, a plurality of support shafts 191 are formed so as to project from an X1 side surface of a printed wiring board 72, and it is to these support shafts 191 that the auxiliary printed wiring board 190 is fixedly mounted.

A description will now be given of a telecommunications apparatus and plug-in unit according to a fifth embodiment of the present invention.

Figure 23:
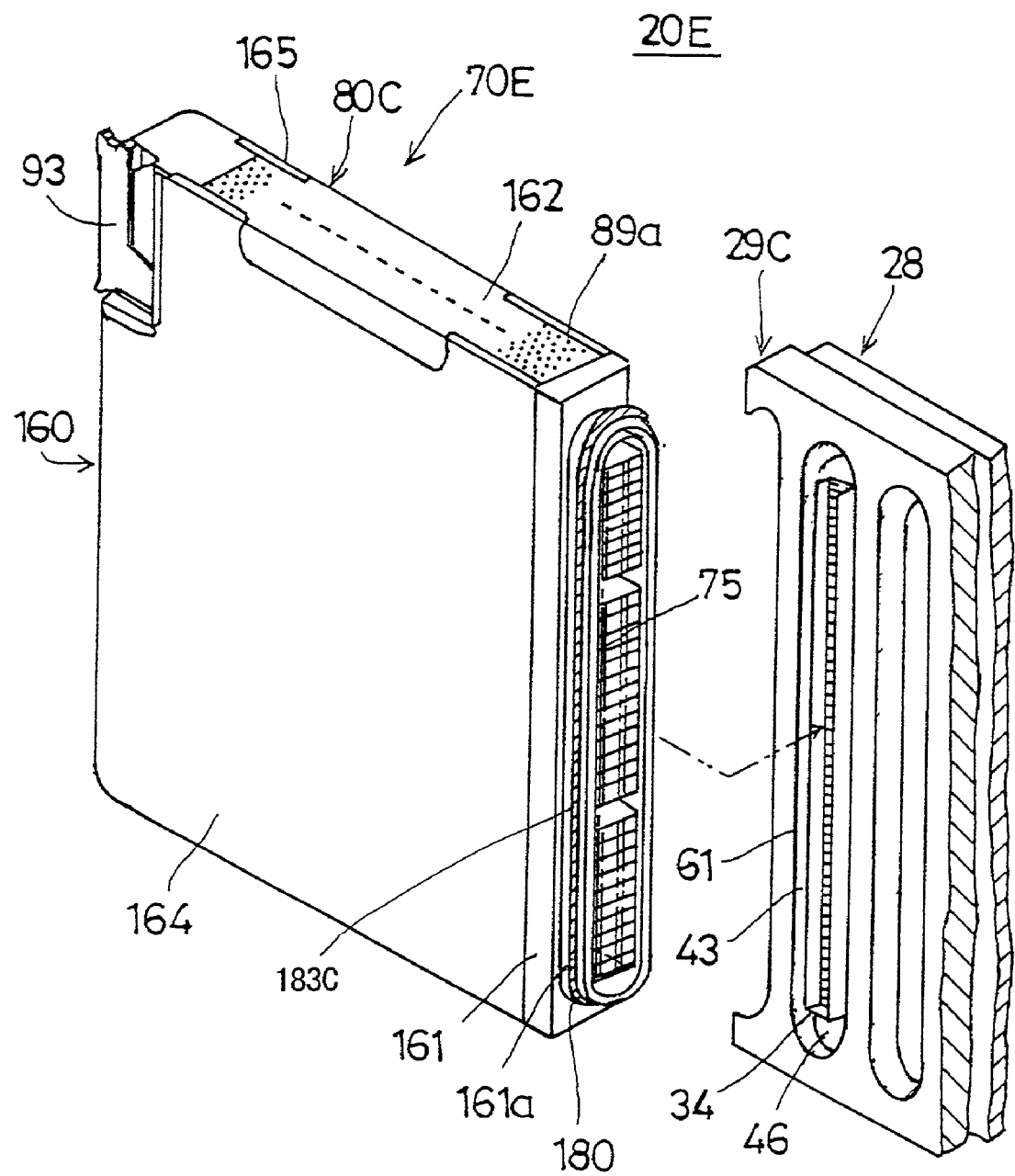
FIG. 23 is a diagram showing a partial view of a telecommunications apparatus according to a fifth embodiment of the present invention.

FIG. 23 is a diagram showing a partial view of a telecommunications apparatus according to a fifth embodiment of the present invention.

As shown in the diagram, a telecommunications apparatus 20E comprises a plug-in unit 70E, in which the seal member 180 is mounted so as to enclose an outer peripheral surface of a forward edge of the cover portion 161a of the metal case 80C. The bulge portion 183c is a positioned so as to face outward.

A frame member 29C is formed without the flange 170 described above, nor is there any seal member 180 mounted thereon.

The plug-in unit 70E is mounted so that the cover portion 161a advances into the interior of the opening 43 of the main frame 40C of the frame member 29 and the seal member 180 contacts the inner peripheral surface of the opening 43.

It should be noted that, although the present invention has been described in the foregoing embodiments with reference to an aluminum casing, in fact the casing may be made of any electrically conductive metal.

The above description is provided in order to enable any person skilled in the art to make and use the invention and sets forth the best mode contemplated by the inventors of carrying out the invention.

The present invention is not limited to the specifically disclosed embodiments, and variations and modifications may be made without departing from the scope and spirit of the present invention.

The present application is based on Japanese Priority Application No. 2000-356010, filed on Nov. 22, 2000, and Japanese Priority Application No. 2001-020587, filed on Jan. 29, 2001, the contents of which are hereby incorporated by reference.

What is claimed is:

1. A telecommunications apparatus comprising:
a substantially box-shaped subrack having a back wiring board mounted with first connectors;
a plurality of shell-type plug-in units configured to be inserted into the subrack so that a second connector of each of the plug-in units is connected to a corresponding one of the first connectors; and
a flexible, electrically conductive seal member disposed between a lateral surface of the plug-in units that are inserted into the subrack and an interior portion of the subrack, said seal member being elastically deformed when a plug-in unit is inserted into the subrack and the second connector thereof is connected to the corresponding first connector so as to enclose both first and second connectors to provide a shield.

2. The telecommunications apparatus as claimed in claim 1, wherein the seal member is made of a material selected from a group consisting of electrically conductive rubber, electrically conductive elastomer, electrically conductive sponge, electrically conductive plastic, electrically conductive gel rubber, electrically conductive silicon rubber, and dispenser gaskets.

3. A telecommunications apparatus comprising:
a substantially box-shaped subrack including a back wiring board having a surface mounted with first connectors; and
a plurality of shell-type plug-in units that are inserted into the subrack so that a second connector of each of the plug-in units is connected to a corresponding one of the first connectors;
wherein the subrack further comprises:
a substantially square metallic frame member,
a plurality of panes aligned within the frame so as to form substantially rectangular openings that accommodate and surround first connectors between adjacent panes, and
a flexible, electrically conductive seal member covering the frame member and the panes,
wherein the frame member is fixedly mounted on the surface of the back wiring board,
wherein a portion of a lateral surface of the plug-in unit that is inserted into the subrack and surrounding each second connector pressing against the frame member so as to elastically deform the seal member and close the openings when the plug-in unit is inserted into the subrack, and thereby to enclose the first and second connectors to provide a shield.

4. The telecommunications apparatus as claimed in claim 3, wherein:
the openings in the frame member are oblong shaped; and
the seal member has a flange portion on a side of the seal member confronting the surface of the back wiring board,
the flange portion entering an interior of the oblong opening.

5. The telecommunications apparatus as claimed in claim 3, wherein:
the openings in the frame member are oblong shaped;
the seal member has a flange portion on a side of the seal member confronting the surface of the back wiring board, the flange portion entering an interior of the oblong opening; and
a lateral surface of the plug-in unit that is inserted into the subrack and that surrounds the plug-in unit connector having an oblong banked portion tapered at a periphery thereof,
the tapered surface of the oblong banked portion pressing the flange portion of the seal member, the seal member elastically deforming so as to conform to the tapered surface when the plug-in unit is mounted in the subrack.

6. The telecommunications apparatus as claimed in claim 3, wherein:
the seal member comprises a flange portion, provided on a surface of the seal member confronting the surface of the back wiring board and projecting from an edge of the oblong opening,
the flange portion being pressed against the surface of the back wiring board and elastically deformed when the frame member is fixedly mounted on the back wiring board.

7. The telecommunications apparatus as claimed in claim 3, wherein:
the seal member comprises, on a surface of the seal member confronting the surface of the back wiring board, a first flange portion projecting from an edge of the oblong opening, and a second flange portion projecting from a periphery of the frame member,
the first and second flange portions being pressed against the surface of the back wiring board and elastically deformed when the frame member is fixedly mounted on the back wiring board.

8. A telecommunications apparatus comprising:
a substantially box-shaped subrack including a back wiring board having a surface mounted with first connectors; and
a plurality of shell-type plug-in units inserted in the subrack so that a second connector of each of the plug-in units is connected to a corresponding one of the first connectors of the subrack;
wherein the subrack further comprises:
a substantially square metallic frame member, and
a plurality of panes aligned within the frame member so as to form substantially rectangular openings that accommodate and surround the first connectors between adjacent panes, the frame member being fixedly mounted on the surface of the back wiring board,
wherein the plug-in unit has a flexible, electrically conductive seal member shaped so as to surround each second connector, and
the seal member is elastically deformed so as to contact the frame member when the plug-in unit is mounted in the subrack, and thereby to enclose the first and second connectors to provide a shield.

9. A telecommunications apparatus comprising:
a substantially box-shaped subrack including a back wiring board and
a plurality of shell-type plug-in units inserted in the subrack so that a second connector of each of the plug-in units is connected to a corresponding one of the first connectors of the subrack, each plug-in unit including:
a flexible, electrically conductive seal member shaped so as to surround the second connector,
wherein the seal member is elastically deformed so as to contact the back wiring board when the plug-in unit is mounted in the subrack, and thereby to enclose the first and second connectors to provide a shield.

10. A telecommunications apparatus comprising:
a substantially box-shaped subrack including a back wiring board having a surface mounted with first connectors; and
a plurality of shell-type plug-in units inserted in the subrack so that a second connector of each of the plug-in units is connected to a corresponding one of the first connectors, the subrack further including:
a substantially square metallic frame member;
a plurality of panes aligned within the frame so as to form substantially rectangular openings that accommodate and surround each second connector between adjacent panes, the frame member being fixedly mounted on the surface of the back wiring board; and
a seal member comprising a core spring member, a finger gasket that engages the core spring member and an electrically conductive cloth wrapped around the finger gasket, the seal member being mounted on inner sides of the frame member openings so as to extend over an entire interior surface of said openings, wherein each plug-in unit has a cover part shaped so as to conform to the frame member openings and surround the second connector on a lateral surface of the plug-in unit inserted into the subrack, edge surfaces of the cover projecting beyond edges of the second connector, and wherein the cover part is fitted into the frame member openings when the plug-in unit is inserted into the subrack so as to elastically deform the finger gasket, so that an elastic force of the elastically deformed finger gasket causes the electrically conductive cloth to contact the cover part along an entire outer peripheral surface of the cover part and provide a shield for the first and second connectors.

11. A shell-type plug-in unit comprising:

a metal casing, containing a printed board therein, and configured to be inserted into a substantially box-shaped subrack having a back wiring board that is mounted with first connectors and a flexible electrically conductive seal member; and a second connector connected a corresponding one of the first connectors when the metal casing is inserted into the subrack;

wherein said metal casing has a lateral surface surrounding the second connector and has a substantially oblong banked portion with a tapered periphery, the tapered periphery statically deforming the seal member when the plug-in unit is inserted into the subrack, so as to enclose the first and second connectors to provide a shield.

12. A shell-type plug-in unit comprising:

a metal casing, containing a printed board therein, and configured to be inserted into a substantially box-shaped subrack having a back wiring board that is mounted with first connectors;

a second connector configured to connect to a corresponding one of the first connectors when the metal casing is inserted into the subrack; and an electrically conductive optical fiber seal member having a through-hole of a size capable of admitting an optical fiber and a slit that extends from an external unit to the through-hole, wherein the optical fiber seal member is compressed after the optical fiber is passed through the slit and fitted into the through-hole so as to engage an opening formed in the metal casing of a size capable of admitting a plurality of optical fibers extending from a photoelectric conversion module mounted on the printed wiring board, to provide a shield with respect to the opening in the metal casing.

13. A shell-type plug-in unit comprising:

a metal casing, containing a printed board therein, and configured to be inserted into a substantially box-shaped subrack having a back wiring board that is mounted with first connectors, and a frame member having openings exposing the first connectors;

a second connector configured to connect to a corresponding one of the first connectors when the metal casing is inserted into the subrack; and a cover part shaped so as to conform to the openings and surround the second connector on a lateral surface of the plug-in unit, edge surfaces of the cover part projecting beyond edges of the second connector, said cover part providing a shield for the first and second connectors when the metal casing is inserted into the subrack.

* * * * *